(12) United States Patent  
Nishikawa

(10) Patent No.: US 8,598,693 B2
(45) Date of Patent: Dec. 3, 2013

(54) DIE PAD PACKAGE WITH A CONCAVE PORTION IN THE SEALING RESIN

(75) Inventor: Kenji Nishikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 167 days.

(21) Appl. No.: 13/206,172

(22) Filed: Aug. 9, 2011

(65) Prior Publication Data

US 2012/0032316 A1 Feb. 9, 2012

(30) Foreign Application Priority Data

Aug. 9, 2010 (JP) .................................. 2010-178900
May 17, 2011 (JP) .................................. 2011-110778

(51) Int. Cl.
*H01L 23/495* (2006.01)
*H01L 21/00* (2006.01)

(52) U.S. Cl.
USPC ........... 257/670; 257/676; 257/787; 361/772; 361/813; 438/123; 438/124

(58) Field of Classification Search
None
See application file for complete search history.

(56) References Cited

U.S. PATENT DOCUMENTS

| 5,604,376 | A | 2/1997 | Hamburgen et al. |
| 5,776,800 | A | 7/1998 | Hamburgen et al. |
| 5,882,955 | A * | 3/1999 | Huang et al. ................... 438/111 |
| 6,577,000 | B2 * | 6/2003 | Sato et al. ..................... 257/730 |
| 7,087,462 | B1 * | 8/2006 | Park et al. ..................... 438/112 |
| 7,351,612 | B2 * | 4/2008 | Gai .............................. 438/117 |
| 2007/0132112 | A1 * | 6/2007 | Ozaki et al. ................... 257/787 |
| 2008/0311705 | A1 * | 12/2008 | Kim .............................. 438/123 |
| 2011/0143498 | A1 * | 6/2011 | Huang et al. ................... 438/108 |

FOREIGN PATENT DOCUMENTS

| JP | 8-046090 | 2/1996 |
| JP | 2001-035868 | 2/2001 |

* cited by examiner

*Primary Examiner* — Alonzo Chambliss
(74) *Attorney, Agent, or Firm* — Young & Thompson

(57) ABSTRACT

A rear surface opposite to one plane of a die pad is formed to be exposed from one plane of a sealing resin. In addition, a concave portion disposed to be parallel with at least a first side of an outermost edge of a central structure and a second side adjacent to the first side, respectively, is formed in the one plane of the sealing resin. Here, a depth of the concave portion is equal to or greater than a height of the outermost edge of the central structure.

36 Claims, 37 Drawing Sheets

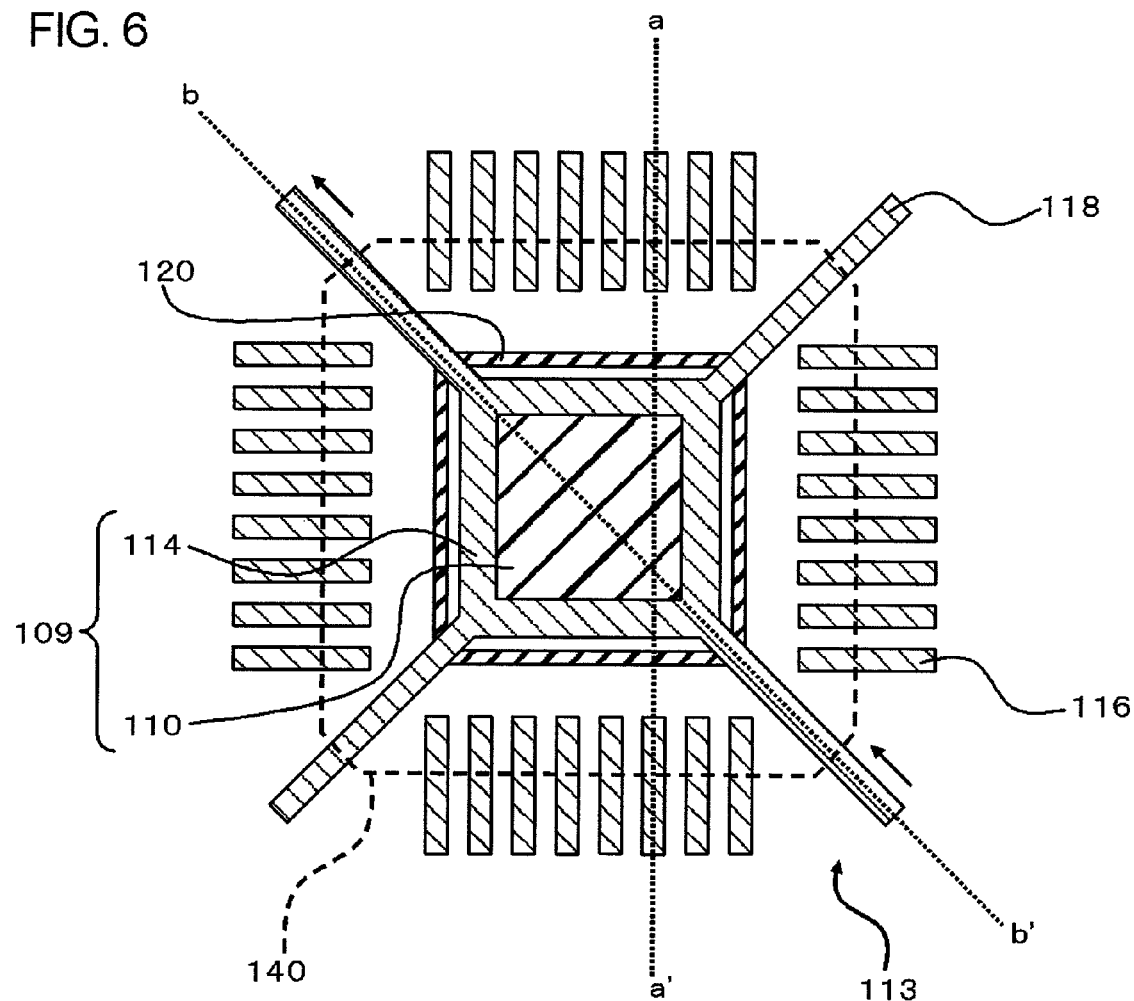

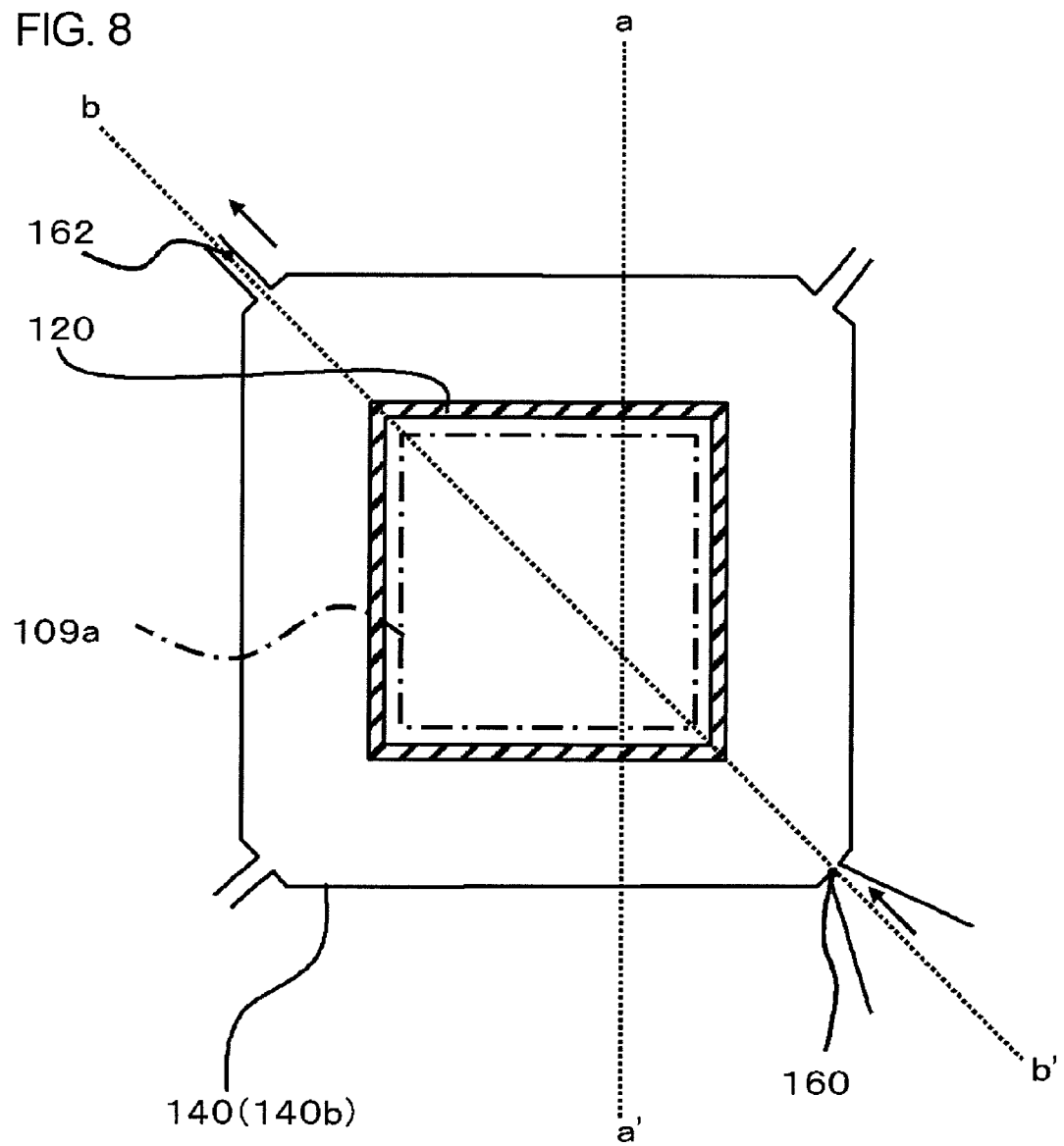

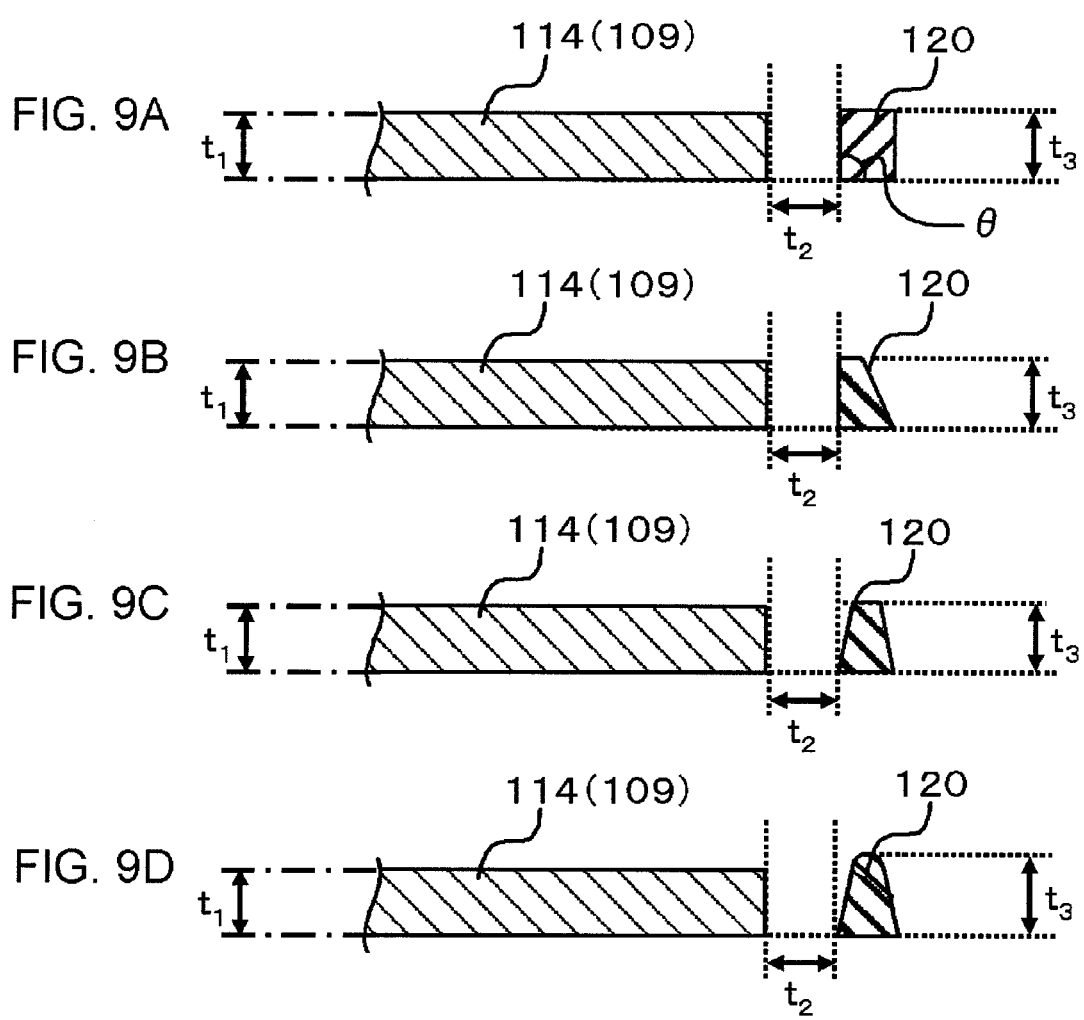

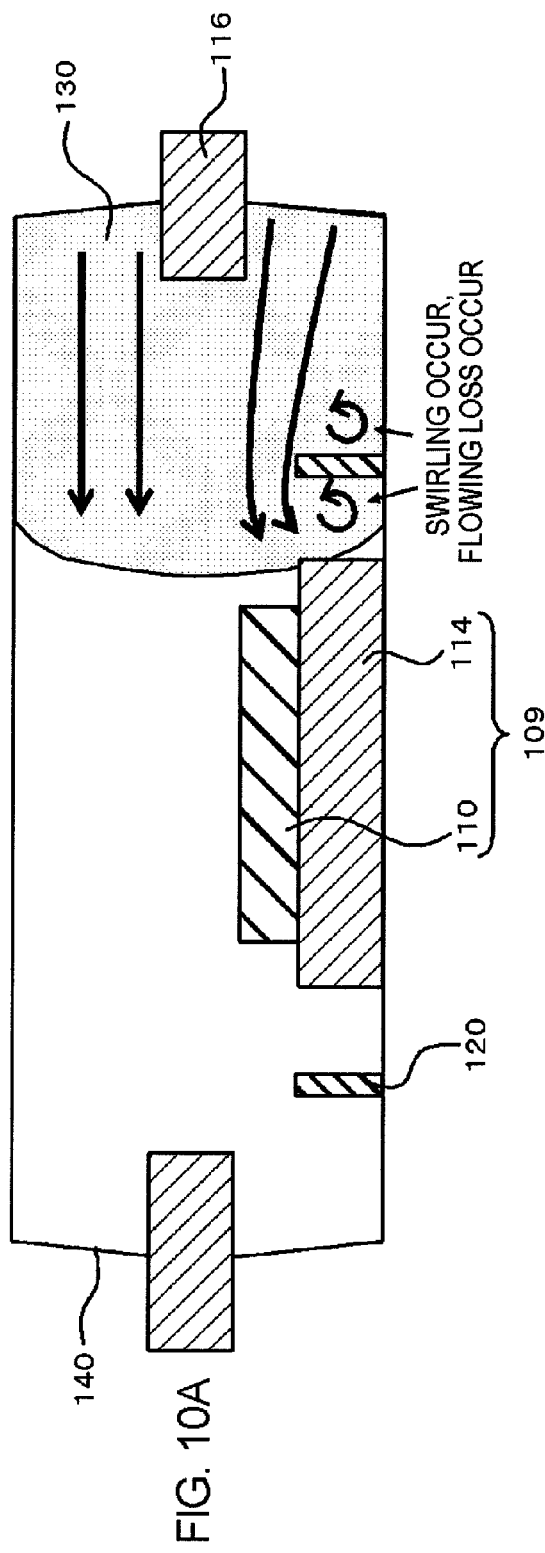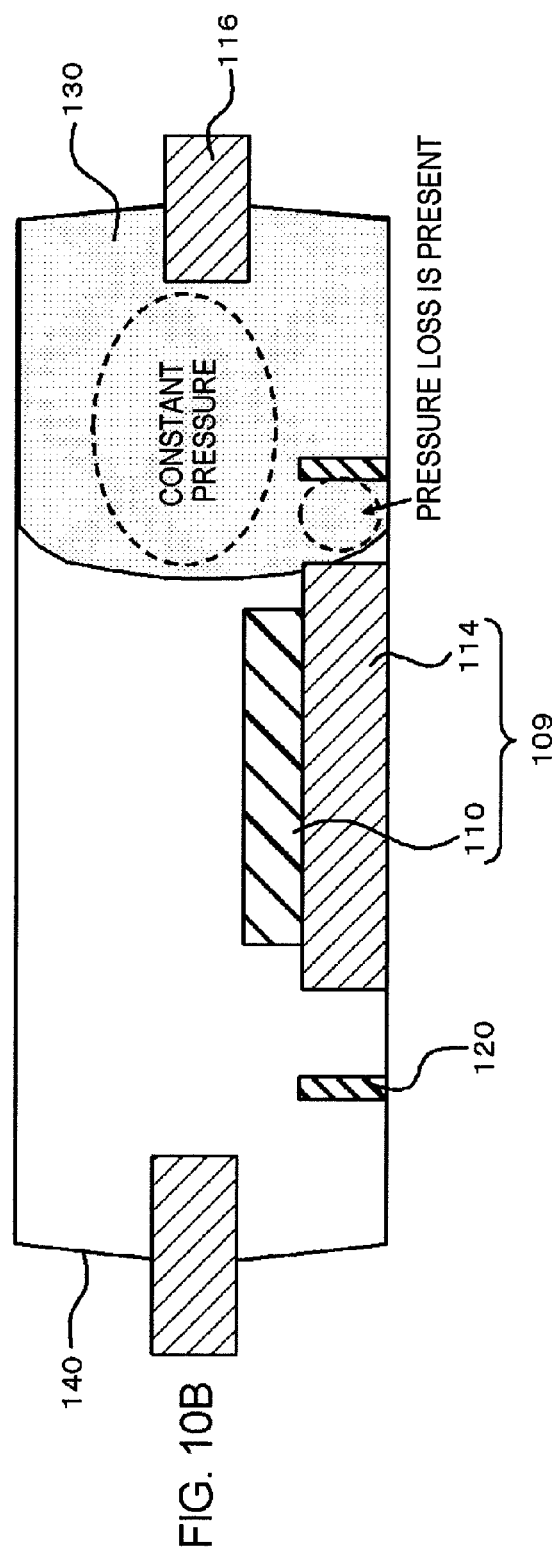

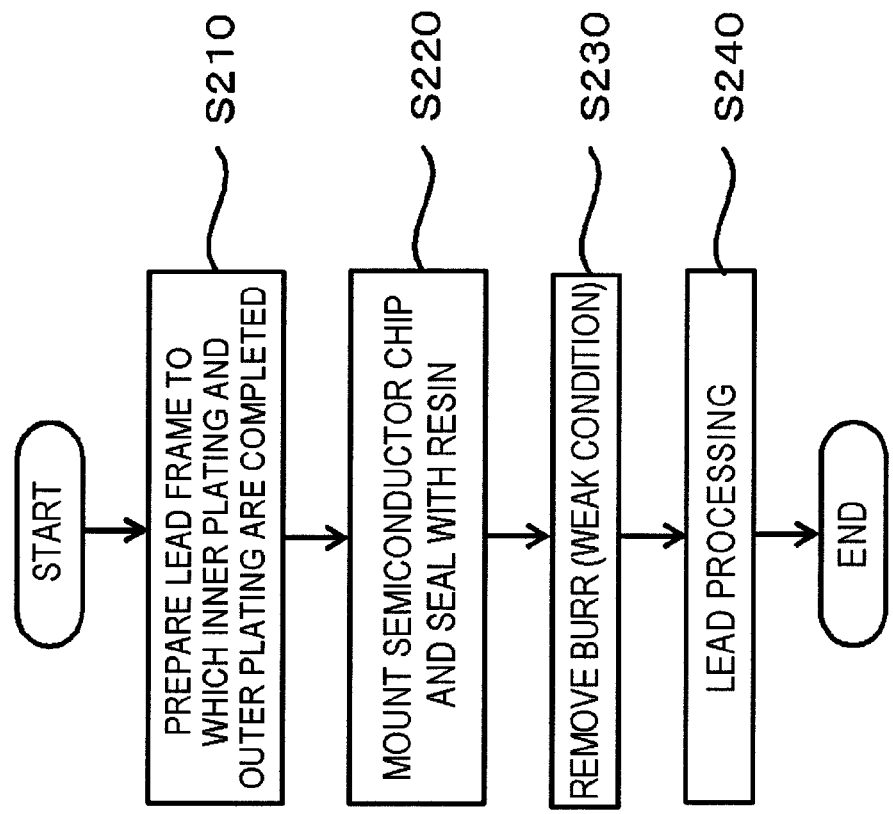
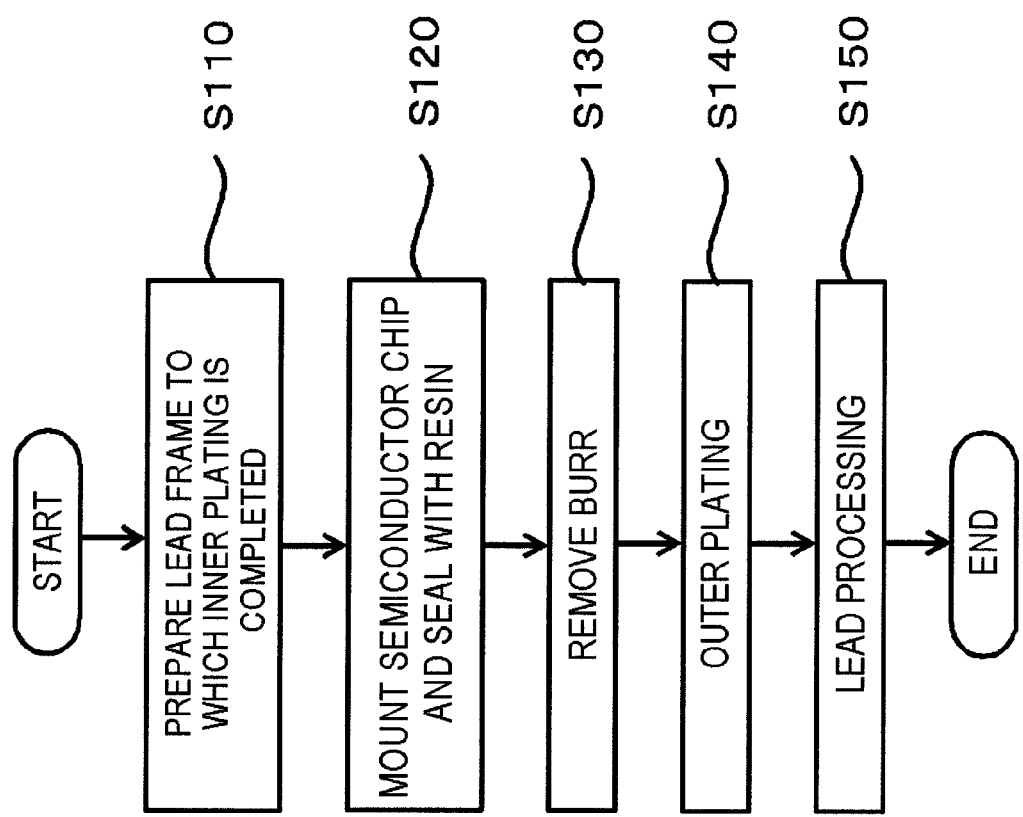

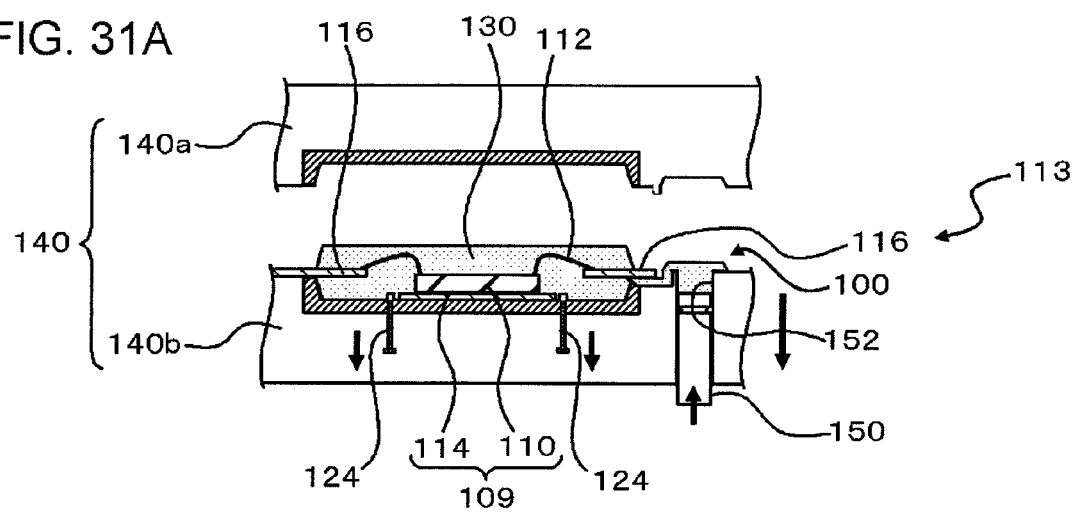
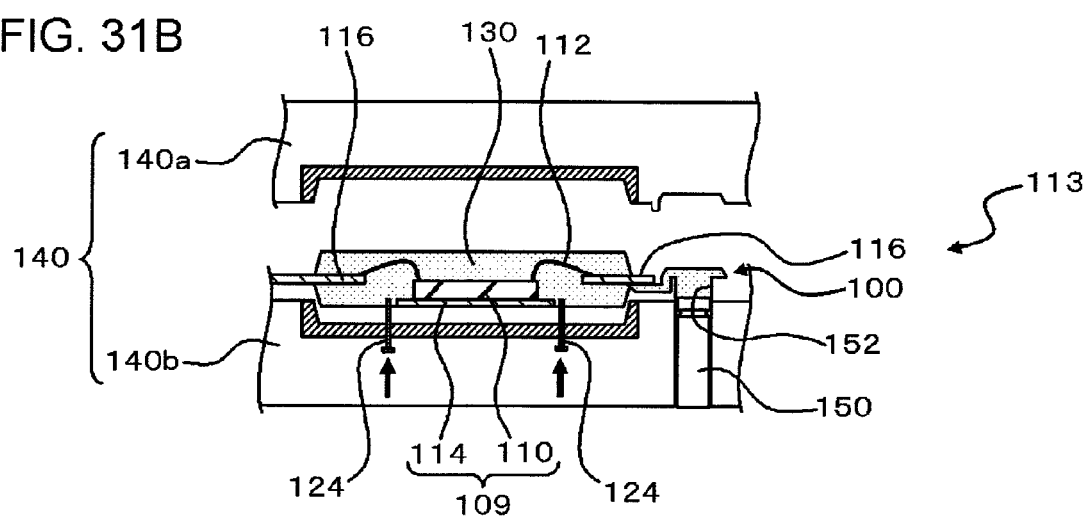

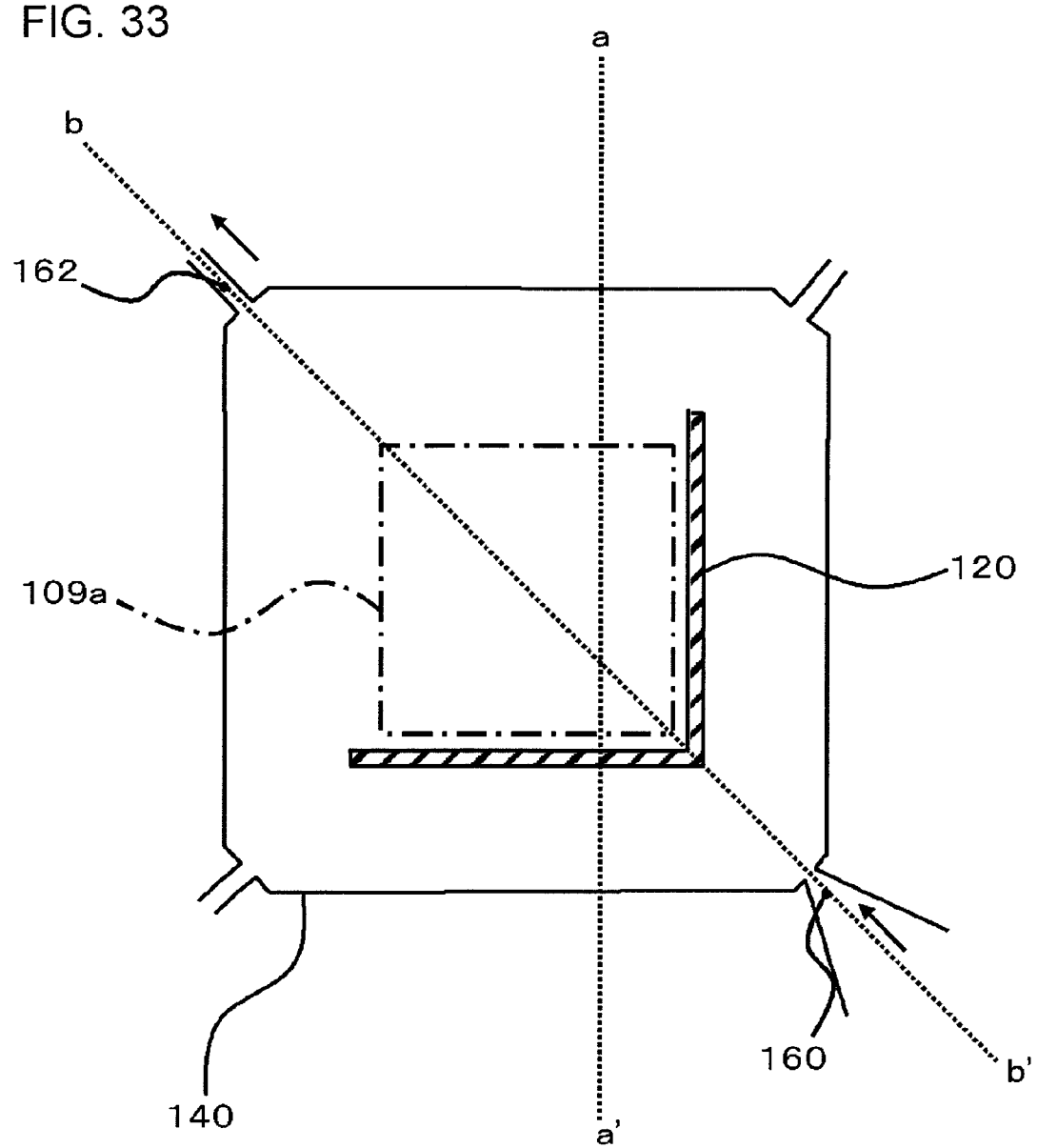

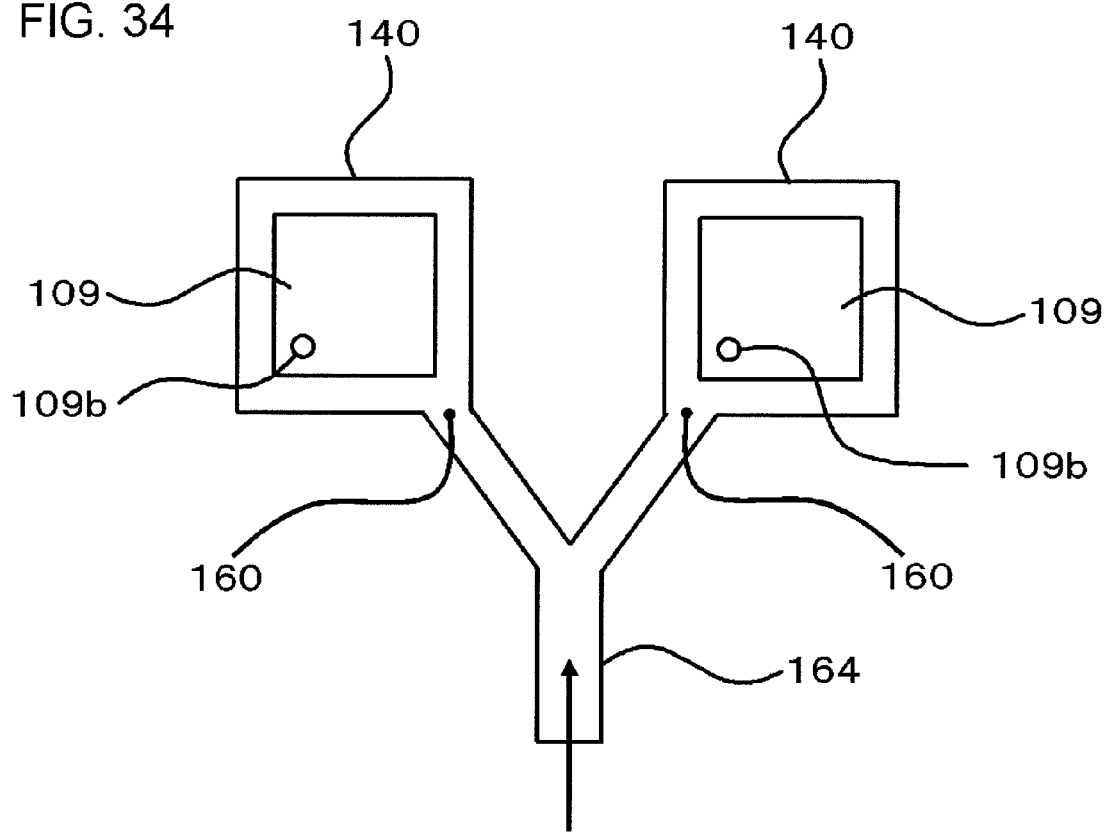

DIE PAD PACKAGE WITH A CONCAVE PORTION IN THE SEALING RESIN

This application is based on Japanese patent application Nos. 2010-178900 and 2011-110778, the contents of which are incorporated hereinto by reference.

BACKGROUND

1. Technical Field

The present invention relates to a semiconductor device, a method of manufacturing a semiconductor device, a mold, and a sealing device.

2. Related Art

In recent years, a semiconductor device having a configuration where a semiconductor chip is sealed with a sealing resin in a state where a plane (rear surface) opposite to a plane (front surface) of a die pad (island portion), on which a semiconductor pallet or a semiconductor chip is mounted, of a lead frame is exposed (hereinafter, referred to as "exposed die pad-type packages") has been developed. In such an exposed die pad-type package, the exposed surface of the die pad is connected to an electrode on a circuit board through a solder. In this manner, the die pad may serve as an external electrode with a low resistance. In addition, the die pad may serve as a heat dissipation path that transfers heat generated in the semiconductor chip to the outside. Therefore, the semiconductor device has been used especially as a high power consumption device.

However, in regard to the exposed die pad-type package of the related art, there is a problem in that in an encapsulation process with the sealing resin by using an encapsulation mold, the sealing resin flows into the rear surface of the die pad and therefore a resin burr is formed on the rear surface that is the exposed surface of the die pad. When such a resin burr is formed, there is a problem in that a part of the heat dissipation path is blocked out by the resin burr, or the like.

Japanese Laid-Open Patent Publication No. 2001-035868 discloses a configuration where a tapered portion is provided at the periphery of the heat dissipation plate (die pad) surface of the lead frame, and an encapsulating mold that is a lower mold is provided with a concave portion at a position that comes into contact with a heat dissipation plate. In this manner, the periphery of the heat dissipation plate and the encapsulation mold are engaged, and thereby it is regarded that the leakage of the resin toward a surface of the heat dissipation plate is prevented during the encapsulation with the resin. Therefore, a process of removing the resin burr after the sealing with the resin may be omitted.

FIG. 37 represents a cross-sectional view illustrating a configuration of a semiconductor device disclosed in Japanese Laid-Open Patent Publication No. 08-046090. In this Japanese Laid-Open Patent Publication No. 08-046090, a technique for solving the following problems is disclosed. After a semiconductor chip (silicon) is sealed with a sealing resin (plastic), the sealed semiconductor chip is taken out from a mold. Then, at the boundary 38 of silicon, plastic, and air, the plastic contracts during cooling from a temperature of a transfer mold. At this time, since the plastic contracts more than the silicon, due to a difference in a thermal contraction, a tension is generated at the boundary of the silicon, plastic, and air. Therefore, there is a problem in that separation occurs frequently at the boundary of the silicon, plastic, and air. Japanese Laid-Open Patent Publication No. 08-046090 discloses a configuration where a plastic molded main body 32 is provided with a notch 37 to maintain an adhesion portion in a close contact state where the adhesion portion is sealed from the atmosphere, to diminish the tension at the boundary of the silicon, plastic, and air, and to mostly prevent the adhesion region from being affected by the plastic main body 32. There is disclosed that such a notch can be easily formed, for example, by a distinct feature portion formed in the lower mold. In addition, there is described that one of various shapes and configurations may be selected (Paragraph 0030, FIG. 8, or the like).

SUMMARY

However, in the technique disclosed in Japanese Laid-Open Patent Publication No. 2001-035868, it is necessary to form the concave portion in the mold, as well as it is necessary to form the shape of the die pad of the lead frame by a special processing. In addition, the machining becomes complex.

In addition, the notch 37 disclosed in Japanese Laid-Open Patent Publication No. 08-046090 is made to simply separate the adhesion region (of the silicon and plastic or the like) from a portion that is most of the plastic main body. Therefore, the occurrence of the resin burr or the like is never taken into consideration. In addition, no examination on the size of the notch or the like is made.

The present inventors found that when sealing the die pad and the semiconductor chip with the sealing resin, if impact is large when the sealing resin collides with a side surface of the die pad, the sealing resin moves around the rear surface of the die pad. Therefore, the present inventors have reviewed a configuration to diminish the flowing velocity of the sealing resin when the sealing resin collides with the side surface of the die pad, and they accomplished the invention.

In an embodiment, there is provided a semiconductor device including a central structure that includes a die pad and a semiconductor chip mounted on one plane of the die pad; a plurality of lead terminals that is spaced from the die pad and is disposed at the periphery of the die pad along the outer edge of the die pad; a hanging lead that has one end connected to the die pad and extends obliquely with respect to the one plane of the die pad in a direction away from the die pad; and a sealing resin that seals the central structure, a part of each of the plurality of lead terminals, and the hanging lead, wherein the rear surface of the die pad opposite to the one plane is formed to be exposed from one plane of the sealing resin, a concave portion, which is disposed to be parallel with at least one first side of an outermost edge of the central structure and a second side adjacent to the first side, respectively, is formed in the one plane of the sealing resin, and a depth of the concave portion at a location under the hanging lead is shallower than that at a location other than the location under the hanging lead, or the concave portion is not formed at the location under the hanging lead.

In one plane of the sealing resin, the inside of the concave portion has surface roughness lower than that in other regions.

Furthermore, in another embodiment, there is provided a semiconductor device including a central structure that includes a die pad and a semiconductor chip mounted on one plane of the die pad; a plurality of lead terminals that is spaced from the die pad and is disposed at the periphery of the die pad along the outer edge of the die pad; a hanging lead that has one end connected to the die pad and extends obliquely with respect to the one plane of the die pad in the direction away from the die pad; and a sealing resin that seals the central structure, a part of each of the plurality of lead terminals, and the hanging lead, wherein the rear surface of the die pad opposite to the one plane is formed to be exposed from one plane of the sealing resin, and a concave portion, which is disposed to be parallel with at least one first side of an outermost edge of the central structure and a second side adjacent to the first side, respectively, and which has a depth equal to or greater than the height of the outermost edge of the central structure, is formed in the one plane of the sealing resin.

Furthermore, in another embodiment, there is provided a method of manufacturing a semiconductor device. The method includes disposing a semiconductor chip structure, which includes a central structure that includes a die pad and a semiconductor chip mounted on one plane of the die pad, a plurality of lead terminals that is spaced from the die pad and is disposed at the periphery of the die pad along the outer edge of the die pad, and a hanging lead that has one end connected to the die pad and extends obliquely with respect to the one plane of the die pad in a direction away from the die pad, in such a manner that the rear surface opposite to the one plane of the die pad comes into contact with one plane of a mold at the inside of a cavity of the mold; and introducing a sealing resin to the cavity of the mold from the one plane side of the die pad, and sealing the central structure, a part of each of the plurality of lead terminals, and the hanging lead with the sealing resin, wherein in the sealing with the sealing resin, a step portion, which is disposed to be parallel with at least one first side of an outermost edge of the central structure and a second side adjacent to the first side, respectively, is formed in the one plane of the mold, and the height of the step portion at a location under the hanging lead is lower than that at a location other than the location under the hanging lead, or the step portion is not formed at the location under the hanging lead.

Furthermore, in another embodiment, there is provided a method of manufacturing a semiconductor device. The method includes disposing a semiconductor chip structure, which includes a central structure that includes a die pad and a semiconductor chip mounted on one plane of the die pad, a plurality of lead terminals that is spaced from the die pad and is disposed at the periphery of the die pad along the outer edge of the die pad, and a hanging lead that has one end connected to the die pad and extends obliquely with respect to the one plane of the die pad in a direction away from the die pad, in such a manner that the rear surface opposite to the one plane of the die pad comes into contact with one plane of a mold at the inside of a cavity of the mold; and introducing a sealing resin to the cavity of the mold from the one plane side of the die pad, and sealing the central structure, a part of each of the plurality of lead terminals, and the hanging lead with the sealing resin, wherein in the sealing with the sealing resin, a step portion, which is disposed to be parallel with at least one first side of an outermost edge of the central structure and a second side adjacent to the first side, respectively, and which has the height equal to or greater than that of the outermost edge of the central structure, is formed in the one plane of the mold.

Furthermore, in another embodiment, there is provided a mold for molding a sealing resin of a semiconductor including a central structure that includes a die pad and a semiconductor chip mounted on one plane of the die pad, a plurality of lead terminals that is spaced from the die pad and is disposed at the periphery of the die pad along the outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead. The mold includes a cavity having one plane disposed in such a manner that the rear surface opposite to the one plane of the die pad comes into contact therewith; and a step portion that is formed on the one plane of the cavity and is disposed to be parallel with at least one first side of an outermost edge of the central structure and a second side adjacent to the first side, respectively, at the time of disposing the central structure in the cavity, of introducing the sealing resin from the one plane side of the die pad, and of sealing the central structure, a part of each of the plurality of lead terminals, and the hanging lead with the sealing resin, wherein the height of the step portion at a location under the hanging lead is lower than that at a location other than the location under the hanging lead, or the step portion is not formed at the location under the hanging lead.

Furthermore, in another embodiment, there is provided a mold for molding a sealing resin of a semiconductor including a central structure that includes a die pad and a semiconductor chip mounted on one plane of the die pad, a plurality of lead terminals that is spaced from the die pad and is disposed at the periphery of the die pad along the outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead. The mold includes a cavity having one plane disposed in such a manner that the rear surface opposite to the one plane of the die pad comes into contact therewith; and a step portion that is formed on the one plane of the cavity, and is disposed to be parallel with at least one first side of an outermost edge of the central structure and a second side adjacent to the first side, respectively, at the time of disposing the central structure in the cavity, of introducing the sealing resin from the one plane side of the die pad, and of sealing the central structure, a part of each of the plurality of lead terminals, and the hanging lead with the sealing resin, and has the height equal to or greater than the height of the outermost edge of the central structure.

Furthermore, in another embodiment, there is provided a sealing device including such a mold.

According to embodiments of the invention, when the sealing resin passes between the step portion and the die pad, the sealing resin flows into between the die pad and the step portion. In this manner, the subsequently flowing sealing resin flows over a region between the step portion and the die pad. Therefore, it is possible to prevent the sealing resin from colliding with a side surface of the die pad at a high speed. Accordingly, it is possible to prevent the sealing resin from flowing onto the rear surface of the die pad and thereby the formation of a resin burr may be prevented.

In addition, an arbitrary combination of the above described components, and configurations obtained by converting the expression of the invention between the method, the device, or the like are effective as aspects of the invention.

According to the invention, it is possible to prevent the resin burr from being formed on the rear surface of the die pad with a simple methodology.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 represents a plan view illustrating an example of the configuration of the semiconductor device and a mold according to the first embodiment;

FIG. 8 represents a plan view illustrating the configuration of a lower mold according to the first embodiment;

FIGS. 9A to 9D represent cross-sectional views illustrating a step portion in the semiconductor device shown in FIG. 6;

FIGS. 10A and 10B represent cross-sectional views illustrating a mechanism in the manufacturing procedure of the semiconductor device according to the first embodiment;

FIGS. 20A and 20B represent flow charts illustrating methods of manufacturing the semiconductor device according to the fourth embodiment and a semiconductor device according to a comparative example, respectively;

FIGS. 31A and 31B represent process cross-sectional views illustrating an example of the manufacturing procedure of the semiconductor device according to the sixth embodiment;

FIG. 33 represents a plan view illustrating another example of the configuration of the step portion formed on a surface of the lower mold according to the embodiment of the invention;

FIG. 34 represents a schematic diagram illustrating a configuration in the case of simultaneously performing a sealing process using a plurality molds;

DETAILED DESCRIPTION

Figure 1:
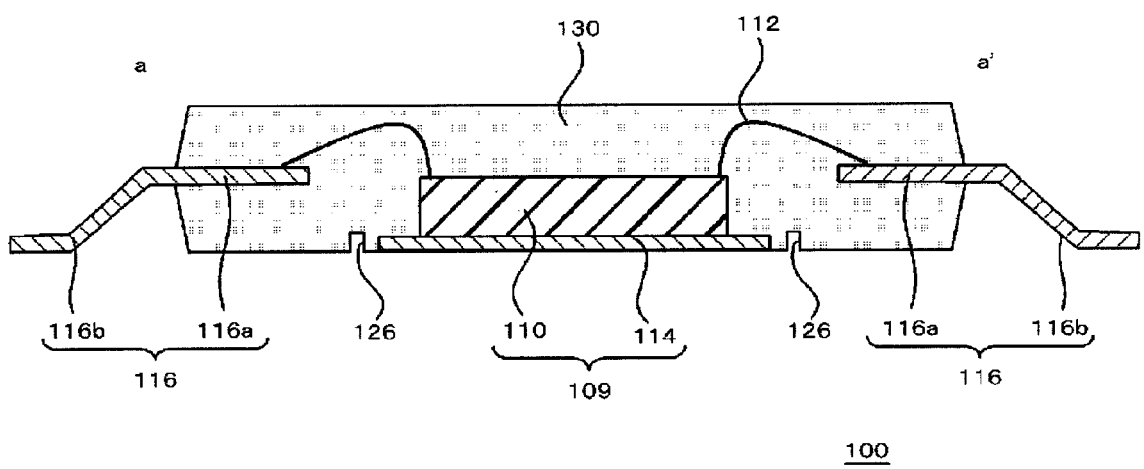
FIG. 1 represents a cross-sectional view illustrating an example of a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all of the drawings, like reference numerals will be given to like parts having substantially the same functions, and description thereof will not be repeated. In the following embodiments, "semiconductor chip" includes "electronic part". In addition, "semiconductor device" includes a exposed die pad-type package such as "electronic part package" and "semiconductor package."

First Embodiment

Figure 2:
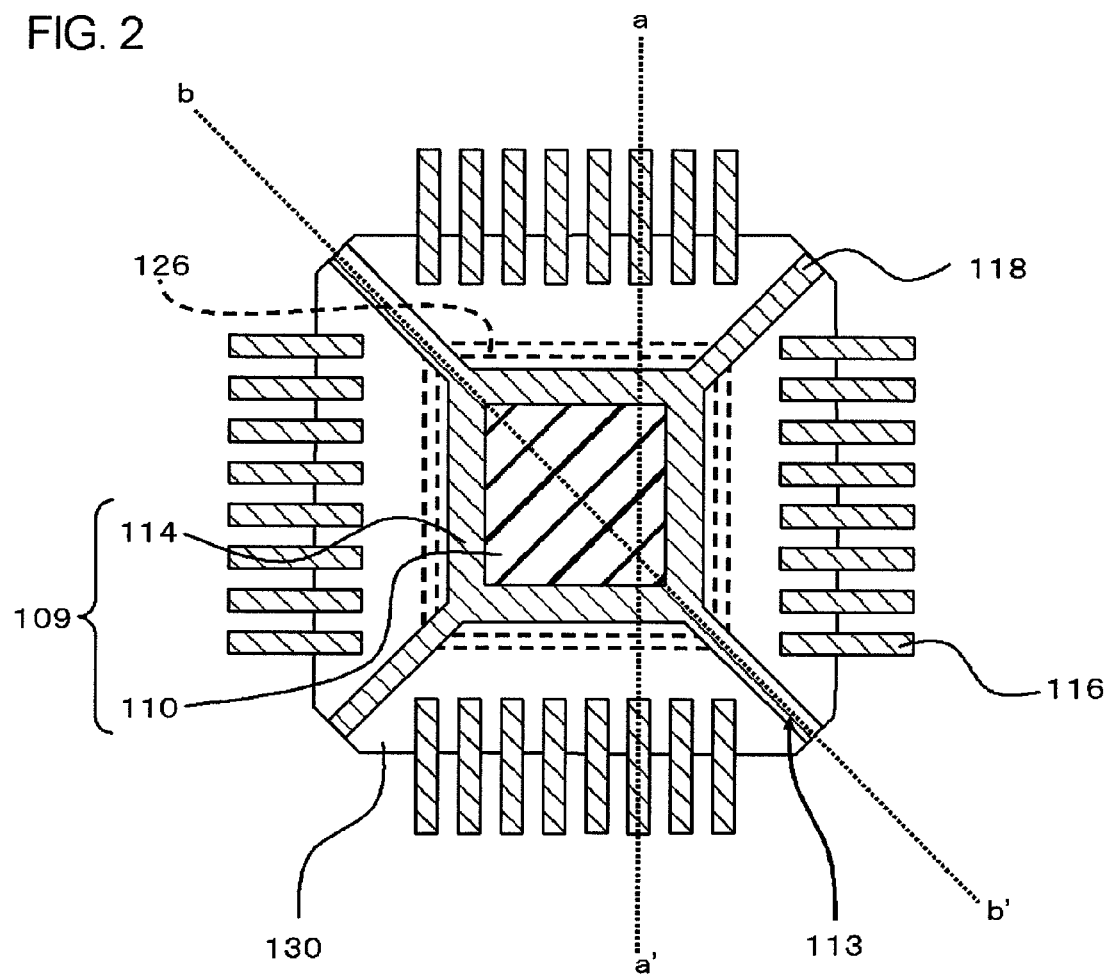
FIG. 2 represents a plan view illustrating an example of the configuration of the semiconductor device according to the first embodiment.
Figure 3:
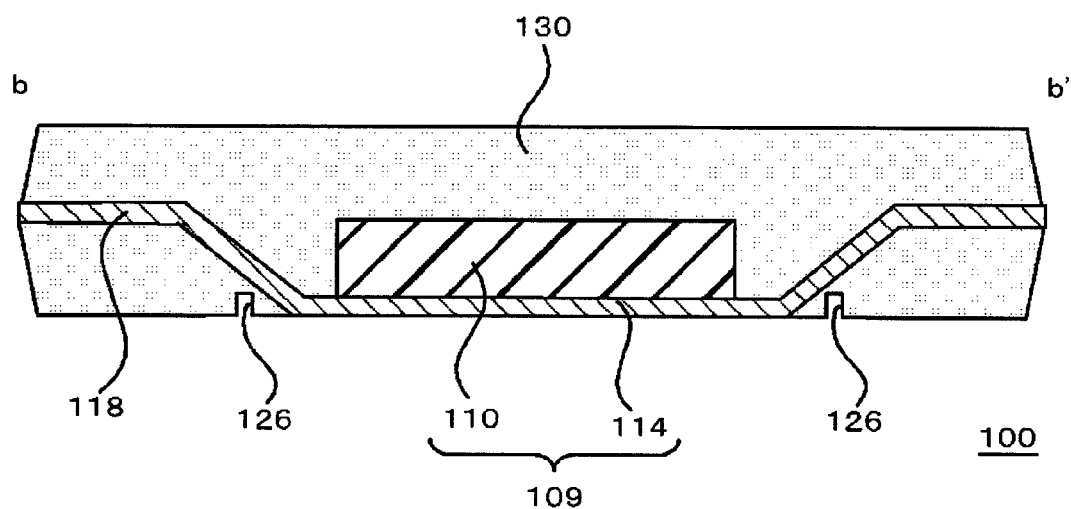
FIG. 3 represents a cross-sectional view along a line b-b' of FIG. 2.

FIG. 1 represents a cross-sectional view illustrating an example of a configuration of a semiconductor device 100 according to a first embodiment. FIG. 2 represents a plan view illustrating an example of the semiconductor device 100 according to the first embodiment. FIG. 1 represents a cross-sectional view taken along a line a-a' of FIG. 2. In addition, in FIG. 2, only the outer edge of a sealing resin 130 is shown for description, and the inner structure of the sealing resin 130 is shown. FIG. 3 represents a cross-sectional view taken along a b-b' line of FIG. 2. In addition, in the following similar plan view, the interior of the sealing resin 130 is similarly shown.

The semiconductor device 100 in the first embodiment includes configurations as described below, that is, a central structure 109 including a die pad 114 and a semiconductor chip 110 mounted on one plane of the die pad 114, a plurality of lead terminals (each including an internal lead 116a and an external lead 116b) 116 that is spaced from the die pad 114 and is disposed at the periphery of the die pad 114 along the outer edge of the die pad 114, a hanging lead 118 that has one end connected to the die pad 114 and that extends obliquely with respect to the one plane of the die pad 114 in a direction away from the die pad 114, a sealing resin 130 that seals the central structure 109, a part (internal lead 116a) of the plurality of lead terminals, and the hanging lead 118. In addition, the rear surface of the die pad 114 opposite to the one plane is formed to be exposed from one plane of the sealing resin 130. In addition, a concave portion 126, which is disposed to be parallel with at least one first side of an outermost edge of the central structure 109 and a second side adjacent to the first side, respectively, is formed in the one plane of the sealing resin 130. Here, the depth of the concave portion 126 is equal to or greater than the height of the outermost edge of the central structure. Hereinafter, the details thereof will be described.

FIG. 2 shows the semiconductor device 100 after being taken out from a mold 140 described later. In addition, in the final shape of the semiconductor device 100, a portion of the hanging lead 118, which is exposed from the sealing resin 130, is cut off. In addition, four corners of the sealing resin 130 are subjected to, for example, C-face chamfering.

As shown in FIG. 2, a lead frame 113 includes the die pad 114, a plurality of lead terminals 116, and the hanging lead 118 described later. The plurality of lead terminals 116 is spaced from the die pad 114 and is disposed to be parallel with the outer edge of the die pad 114 at the periphery of the die pad 114.

Here, in each of the "lead terminals 116", a portion located inside the sealing resin 130 is referred to as an "internal lead 116a", and an exposed portion outside the sealing resin 130 is referred to as an "external lead 116b." Hereinafter, when "lead terminal 116" is used without a specific explanation, this includes both portions.

In addition, in the lead frame 113, an inner plated layer (not shown) is formed on a top face of a front end of the internal lead 116a. Here, the "inner plated layer" is a plated layer including Ag, Au, Pd, an alloy including these, or the like. When the inner plated layer is formed, it is possible to improve an adhesion property between the internal lead 116a and each of bonding wires 112.

In addition, the semiconductor chip 110 is mounted on one plane of the die pad 114 through a mounting material (not shown). An electrode pad (not shown) of the mounted semiconductor chip 110 is connected to a front end of the internal lead 116a through the bonding wire 112. As the bonding wire 112, for example, Au, Cu, or the like may be exemplified.

In addition, the die pad 114 exposed from the sealing resin 130 may be used as an external electrode such as a ground electrode. In this case, an electrode pad of the semiconductor chip 110 and a top surface of the die pad 114 may be connected by the bonding wire 112. In addition, in the top surface of the die pad 114, the inner plated layer may be formed on a portion to which at least the bonding wire 112 is connected.

On the other hand, an outer plated layer (not shown) described later is formed on the rear surface of the die pad 114. In this manner, it is possible to improve an adhesion property of solder, at the time of mounting the die pad 114 on a circuit board (not shown) or the like.

In addition, one end of the hanging lead 118 is connected to the die pad 114. The bonding wire 112 that electrically connects the semiconductor chip 110 and the lead terminals 116, the die pad 114, the semiconductor chip 110, a part of each of the lead terminals 116, and the hanging lead 118 are sealed with the sealing resin 130.

In addition, the semiconductor chip 110 and the die pad 114 may have a rectangular shape in a plan view. However, the planar shape of the semiconductor chip 110 and the die pad 114 is not limited to this. In addition, in this embodiment, a structure in which the die pad 114 and the semiconductor chip 110 are laminated in this order is referred to as a central structure 109. In this embodiment, the die pad 114 has a plane area larger than that of the semiconductor chip 110. Therefore, in this embodiment, the outermost edge of the central structure 109 is defined by the outer edge of the die pad 114. In addition, the hanging lead 118 is provided at four corners of the die pad 114, respectively. When the plane area of the die pad 114 is increased, it is possible to make a thermal resistance in a heat dissipation path between the die pad 114 and the outside of the semiconductor device 100 low. That is, a heat dissipation property may be improved.

As shown in FIG. 1, in each of the lead terminals 116, the internal lead 116a is disposed at a position higher than that of the die pad 114. In addition, as described above, the internal lead 116a is connected to the electrode pad (not shown) of the semiconductor chip 110 through the bonding wire 112. In addition, the internal plated layer (not shown) described later is formed at an end portion of the internal lead 116a.

In addition, as shown in FIG. 1, in the lead terminal 116, the external lead 116b is bent to be mounted on the circuit board (not shown). In addition, as is the case with the rear surface of the die pad 114, an outer plated layer described later is formed on the external lead 116b. In this manner, it is possible to improve an adhesion property of solder at the time of mounting the semiconductor device 100 on a circuit board or the like.

In addition, as shown in FIG. 3, one end of the hanging lead 118 is connected to a die pad 114. In addition, the hanging lead 118 is bent toward an upper direction at a connection point with the die pad 114. In this manner, the hanging lead 118 extends obliquely with respect to one plane of the die pad 114 in a direction away from the die pad 114. In this manner, the hanging lead 118 has the same height as that of the internal lead 116a in the lead terminal 116 at an end surface (a side surface) of the sealing resin 130.

In this embodiment, the semiconductor device 100 may be a exposed die pad-type package having a configuration where the rear surface of the die pad 114 opposite to the one plane on which the semiconductor chip 110 is mounted is exposed from the sealing resin 130. In this manner, it is possible to make the die pad 114 function as an external electrode, or a heat dissipation path. Therefore, the semiconductor device 100 may be used as a high power consumption device.

In addition, in regard to the first embodiment, a concave portion 126 that is disposed with a predetermined distance from the die pad 114 (central structure 109) and has a depth equal to or greater than the height of the outermost edge of the central structure 109 is formed in the sealing resin 130 at the rear side of the die pad 114.

In addition, the concave portion 126 is disposed to be parallel with at least a first side of the outermost edge of the central structure 109 and a second side adjacent to the first side, respectively. Here, "disposed to be parallel with" means "disposed to be parallel with each side." In addition, this disposition includes a case of being disposed to be substantially parallel with each side and being adjacently disposed in a manner that does not come into contact with the central structure 109.

In addition, the concave portion 126 is formed to be parallel with each side of the outermost edge of the central structure 109. In addition, the concave portion 126 is continuously formed to be parallel with the entirety of the outermost edge of the central structure 109. The details of a mold 140 for forming such a concave portion 126 will be described later.

Next, a method of manufacturing the semiconductor device 100 according to the first embodiment will be described using FIGS. 4 to 10. The method of manufacturing the semiconductor device according to the first embodiment includes the following processes. First, such a semiconductor chip structure is disposed in a mold 140 in such a manner that the rear surface of the die pad 114 opposite to the one plane comes into contact with one plane inside the cavity of mold 140 (mold displacing process). Here, the semiconductor chip structure includes the central structure 109 that includes the die pad 114 and the semiconductor chip 110 mounted on one plane of the die pad 114, the plurality of lead terminals 116 that is spaced from the die pad 114 and is disposed at the periphery of the die pad 114 along the outer edge of the die pad 114, and the hanging lead 118 that has one end connected to the die pad 114 and extends obliquely with respect to the one plane of the die pad 114 in a direction away from the die pad 114. Next, in the cavity of the mold 140, the sealing resin 130 is introduced into the cavity of the mold 140 from one plane side of the die pad 114, and the central structure 109, a part of each of the plurality of lead terminals 116, and the hanging lead 118 are sealed with the sealing resin 130. At this time, in the sealing process with the sealing resin 130, a step portion 120, which is disposed to be parallel with at least one first side of the outermost edge of the central structure 109 and the second side adjacent to the first side, respectively, and which has the height equal to or greater than that of the outermost edge of the central structure 109, is formed in one plane of the mold 140. Hereinafter, the details thereof will be described.

Figure 4:
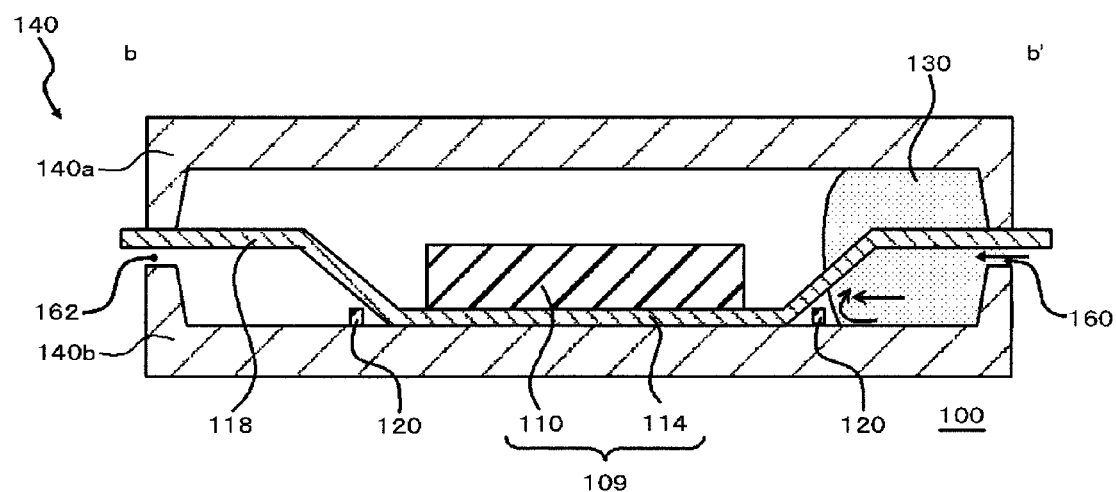
FIG. 4 represents a process cross-sectional view illustrating an example of a manufacturing procedure of the semiconductor device according to the first embodiment.
Figure 5A:
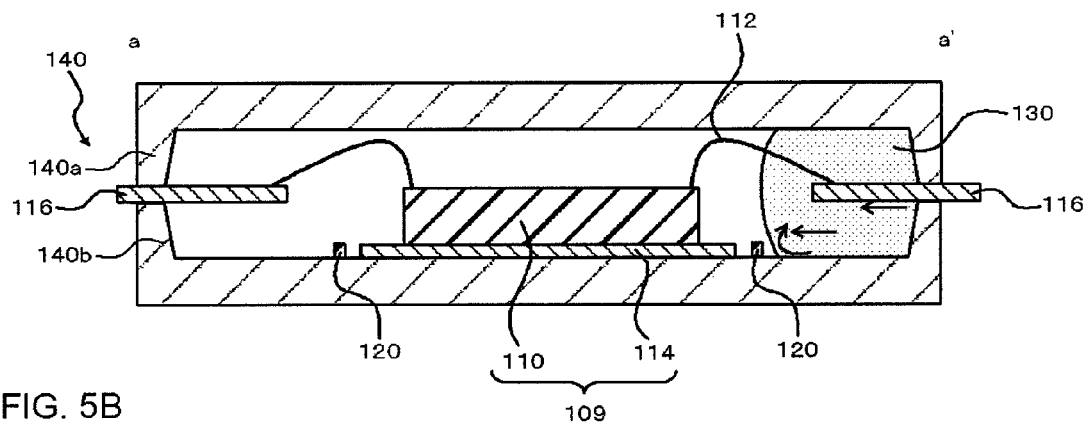
FIGS. 5A and 5B represent process cross-sectional views illustrating an example of the manufacturing procedure of the semiconductor device according to the first embodiment.
Figure 5B:
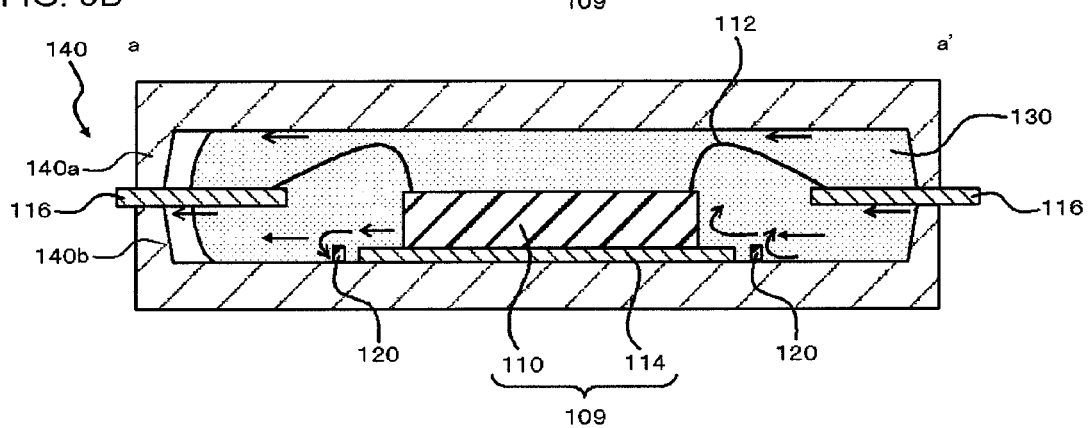

FIGS. 4, 5A, and 5B represent process cross-sectional views illustrating an example of a manufacturing procedure of the semiconductor device 100 according to this embodiment of the invention. FIG. 6 represents a plan view illustrating an example of the semiconductor device 100 and the mold (encapsulation mold) 140 in regard to the manufacturing procedure shown in FIGS. 4, 5A, and 5B. FIG. 4 corresponds to a cross-sectional view taken along a line b-b' of FIG. 6, and FIGS. 5A and 5B correspond to a cross-sectional view taken along a line a-a' of FIG. 6. In this embodiment, the mold 140 may be configured to be taken into the sealing device. In addition, in this embodiment, the sealing with the sealing resin 130 may be performed by transfer-molding.

As shown in FIGS. 4, 5A, and 5B, in this embodiment, the mold 140 may include an upper mold 140a and a lower mold 140b.

Figure 7:
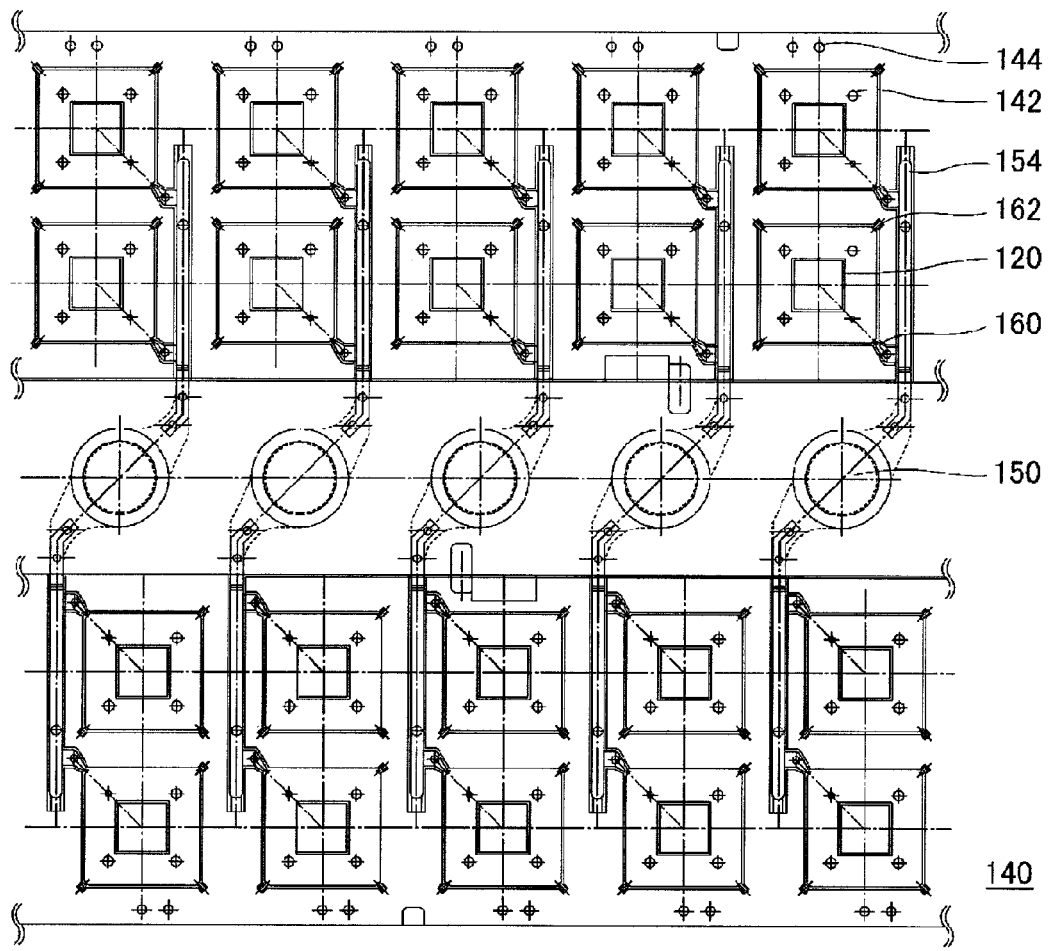
FIG. 7 represents a plan view illustrating a configuration of a lower mold according to the first embodiment.

First, an outline of the mold 140 used in this embodiment will be described by using FIGS. 7 and 8. FIGS. 7 and 8 represent plan views illustrating a configuration of the lower mold 140b in the first embodiment. FIG. 8 shows a cavity portion in FIG. 7.

As shown in FIG. 7, a cavity (reference numeral thereof is not attached) for sealing a plurality of semiconductor devices 100 is formed in the lower mold 140b of the mold 140. In addition, a cavity of the upper mold 140a is formed in a portion corresponding to the cavity of the lower mold 140b.

Here, for example, as shown in FIG. 7, a plurality of cavities is formed in such a manner that two lead frames 113, each for manufacturing ten semiconductor devices 100, are disposed at upper and lower sides in a rotationally symmetrical structure.

In addition, positioning pins 144 for a positional alignment of the lead frames 113 are provided to the lower mold 140b. In addition, opening holes (not shown) corresponding to the positioning pins 144 are formed in the lead frame 113.

Plungers 150 that extrude the sealing resin 130 are provided at the center of the lower mold 140b. In the sealing process with the resin 130, each of the plungers 150 extrudes the sealing resin 130 that is molten to each runner 154. In addition, the runner 154 guides the sealing resin 130 extruded by the plunger 150 to a plurality of cavities. Each of the cavities is connected to the runner 154 through a gate 160. The sealing resin 130 flows into each of the cavities from the runner 154 through the gate 160.

Here, the gate 160 that makes the sealing resin 130 flow into the cavity is provided at a corner portion of the sealing resin 130 of the semiconductor device 100. In addition, air vents 162 are provided at three corner portions other than the corner portion at which the gate 160 is provided. In this manner, when the sealing resin 130 flows, it is possible to discharge air.

In addition, four ejection pins 142 are provided at each of the cavities. The ejection pins 142 are provided on an extended line of each diagonal line of a step portion 120 described below. In addition, the ejection pins 142 push and separate the sealed semiconductor device 100 from a cavity surface after the sealing. In addition, here, only one ejection pin 142 located at the side of the gate 160 has a smaller diameter.

FIG. 8 shows one of cavity portions shown in FIG. 7. In this embodiment, a step portion 120 is provided in a surface (one plane) inside the cavity of the lower mold 140b. Here, the step portion 120 is provided to form the concave portion 126 of the semiconductor device 100. In addition, when the die pad 114 of the lead frame 113 and the semiconductor chip 110 mounted on the die pad 114 are disposed on the surface of the lower mold 140b, the step portion 120 is spaced from the outermost edge of the central structure 109 with a predetermined distance and is disposed at the periphery of the central structure 109 in a manner that is parallel with each side of the outermost edge of the central structure 109. In addition, the step portion 120 is provided to have the height equal to or greater than that of the outermost edge of the central structure 109. In addition, in FIG. 8, the outermost edge of the central structure 109 is drawn by a broken line as an outermost edge 109a of the central structure 109.

Returning to FIG. 6, description will be given to a state where the lead frame 113 (semiconductor chip structure) on which the semiconductor chip 110 is mounted is disposed in the above-described lower mold 140b. In this embodiment, the outermost edge of the central structure 109 is the same as the outer edge of the die pad 114, such that the step portion 120 may be configured to be spaced from the die pad 114 with a predetermined distance and to be disposed at the periphery of the die pad 114 in a manner that is parallel with each side of the outer edge of the die pad 114. In this manner, when the sealing with the sealing resin 130 is performed, it is possible to suppress the sealing resin 130 from flowing into the rear surface of the die pad 114. As shown in FIGS. 6 and 8, in this embodiment, the step portion 120 is continuously formed to surround the entirety of the outer edge (the outermost edge 109a of the central structure) of the central structure 109. In this manner, when the sealing with the sealing resin 130 is performed, it is possible to diminish the flow speed of the sealing resin 130 in all directions of the periphery of the die pad 114.

FIGS. 9A to 9D represent cross-sectional views illustrating the configuration of the step portion in the semiconductor device shown in FIG. 6. In this embodiment, the height of the step portion 120 may be equal to or greater than that of a member defining the outermost edge of the central structure 109. That is, in this embodiment, the height of the step portion 120 may be equal to or greater than that of the die pad 114.

FIG. 9A shows a case where the step portion 120 has a rectangular cross-sectional shape.

In addition, as shown in FIG. 9B, a shape of a cross-section of the step portion 120 in a direction orthogonal to an extending direction is, for example, a trapezoid. In this case, an angle θ made by a side surface of the step portion 120 that faces the die pad 114 and a bottom surface of the lower mold 140b is close to 90°. On the other hand, an angle made by a side surface opposite to the side surface of the step portion 120 that faces the die pad 114 and a bottom surface of the lower mold 140b is 90° or less. In this manner, the step portion 120 may be formed in such a manner that one side surface of the step portion 120 is oblique at an angle of 90° or less.

Therefore, in the case of using the mold of FIG. 9B, the semiconductor device 100 has a trapezoidal cross-sectional shape in a direction orthogonal to the extending direction of the concave portion 126.

Here, the angle θ made by the side surface of the step portion 120 that faces the die pad 114 and the bottom surface of the lower mold 140b may be 90° or less. In this manner, when the semiconductor device 100 is taken out from the lower mold 140b after the die pad 114, the semiconductor chip 110, or the like are sealed with the sealing resin 130, it is possible to smoothly take out the semiconductor device 100. In addition, from such a viewpoint, the angle θ made by the side surface of the step portion 120 that faces the die pad 114 and the bottom surface of the lower mold 140b may be less than 90°, for example, 89.9° or less.

FIGS. 9C and 9D illustrate examples in a case where the angle θ made by the side surface of the step portion 120 that faces the die pad 114 and the bottom surface of the lower mold 140b is, for example, substantially 87° or less. In FIG. 9C, the shape of the cross-section of the step portion 120 is a trapezoid. In FIG. 9D, the shape of the cross-section of the step portion 120 is a trapezoid where the top surface thereof is curved. In addition, this is illustrative only and the cross-section of the step portion 120 may have various shapes.

In the case of using the mold of FIG. 9C or 9D, in the semiconductor device 100, an angle θ made by a side surface of the concave portion 126 that faces the die pad 114 and a plane, at which an opening is formed, of the concave portion 126 is 87° or less. In this manner, when the semiconductor device 100 is taken out from the lower mold 140b after the die pad 114, the semiconductor chip 110, or the like are sealed with the sealing resin 130, it is possible to smoothly take out the semiconductor device 100. In addition, the above-described "angle made by the side surface of the concave portion 126 that faces the die pad 114 and the plane, at which the opening is formed, of the concave portion 126" is the same as the "angle made by the side surface of the step portion 120 that faces the die pad 114 and the bottom surface of the lower mold 140b".

On the other hand, when the angle θ made by the side surface of the step portion 120 that faces the die pad 114 and the bottom surface of the lower mold 140b is too small, the effect of suppressing a phenomenon where the sealing resin 130 flows onto the rear surface of the die pad 114 is decreased.

From this viewpoint, in this embodiment, the angle θ made by the side surface of the step portion 120 that faces the die pad 114 and the bottom surface of the lower mold 140b may be 80° or more.

Here, in regard to this embodiment, a thickness of the central structure 109 at the outermost edge thereof (in this embodiment, a thickness of the die pad 114) is set to $t_1$, and a distance $t_2$ between the outermost edge of the central structure 109 (outer edge of the die pad 114) and the step portion 120 is substantially equal to or less than $5 \times t_1$. In this manner, when the sealing process with the sealing resin 130 is performed, there may be expected an effect of suppressing the flow of the sealing resin 130 from directly colliding with a side surface of the die pad 114 and thereby suppressing the resin from flowing onto the rear surface of the die pad 114. More preferably, the distance $t_2$ between the outermost edge of the central structure 109 (outer edge of the die pad 114) and the step portion 120 may be equal to or less than the thickness $t_1$ of the central structure 109 at the outermost edge thereof. In this manner, when the sealing process with the sealing resin 130 is performed, there may be expected further effect of suppressing the flow of the sealing resin 130 from directly colliding with a side surface of the die pad 114 and thereby suppressing the resin from flowing onto the rear surface of the die pad 114.

Specifically, the distance $t_2$ between the outermost edge of the central structure 109 (outer edge of the die pad 114) and the step portion 120 may be equal to or greater than 0.1 mm and equal to or less than 4 mm, and more preferably equal to or greater than 0.5 mm and equal to or less than 2 mm. When the distance is equal to or greater than the lower limit, external dimensional accuracy and dispositional accuracy may be equal to or greater than external dimensional accuracy and dispositional accuracy of the lead frame 113 with respect to the lower mold 140b. That is, it is possible to prevent the central structure 109 and the step portion 120 from coming into contact with each other. On the other hand, when the distance is equal to or less than the upper limit, when the sealing with the sealing resin 130 is performed, it is possible to reliably diminish an inflow velocity of the sealing resin 130 at the periphery of the die pad 114.

In addition, the height $t_3$ of the step portion 120 may be equal to or greater than the thickness $t_1$ of the central structure 109 at the outermost edge portion. In this manner, it is possible to prevent the resin burr from being formed on the rear surface of the die pad 114. The details of the reason thereof will be described later. In addition, the height $t_3$ of the step portion 120 may be substantially equal to or less than $3 \times t_1$. In this manner, it is possible to stably manufacture the semiconductor device 100.

In addition, the surface roughness of the step portion 120 is lower than that in other regions in the bottom surface of the lower mold 140b. The surface roughness of the sealing resin 130 other than the concave portion 126 is substantially 10 μm. On the other hand, the surface roughness inside the concave portion 126 is 1 μm or less.

In the case of using such a mold, the surface roughness of the inside of the concave portion 126 may be lower than that of other regions in the one plane of the sealing resin 130. In this manner, when the semiconductor device 100 is taken out from the lower mold 140b after the sealing with the sealing resin 130, a frictional force that occurs between the concave portion 126 of the sealing resin 130 and the step portion 120 of the lower mold 140b becomes small. Therefore, it is possible to smoothly take out the semiconductor device 100 from the lower mold 140b.

The step portion 120 having such surface roughness is subjected to a processing such as a polishing in advance in such a manner that the surface roughness of at least the step portion 120 in the lower mold 140b becomes low. In addition, in a case where the sealing resin 130 including a filler, the sealing process is repeated, such that the surface of the step portion 120 is planarized by the sealing resin 130. In this manner, it is possible to make the surface roughness of the step portion 120 low.

Next, a procedure of the sealing of the die pad 114, the semiconductor chip 110, or the like with the sealing resin by using the mold 140 having such a configuration will be described.

First, the lead frame 113 including the die pad 114 on which the semiconductor chip 110 is mounted is disposed at a predetermined location in the cavity of the lower mold 140b of the mold 140.

Subsequently, the lower mold 140b is allowed to move toward the upper mold 140a, and a space (cavity) for introducing the sealing resin 130 is formed between the upper mold 140a and the lower mold 140b. Next, in the mold 140, the sealing resin 130 is introduced from one plane side of the die pad 114, and thereby the semiconductor chip 110 and the die pad 114, the internal lead 116a of the lead terminal 116, and a part of the hanging lead 118 are sealed with the sealing resin 130.

In regard to this embodiment, as shown in FIGS. 4 and 6, the sealing resin 130 is introduced from the gate 160 of the corner portion of the mold 140 at which the hanging lead 118 is provided. In addition, the air vent 162 that is an air hole from which air is discharged is formed on a diagonal line of the gate 160.

Next, in regard to this embodiment, a flowing mechanism of the sealing resin 130 will be described. First, for comparison, the flowing mechanism of the sealing resin 130 in the case of not having the step portion 120 when the semiconductor chip 110, the die pad 114, or the like are sealed with the sealing resin 130 will be described. FIG. 35 represents a cross-sectional view illustrating a mechanism in regard to a manufacturing procedure of the semiconductor device in the case of not having the step portion 120.

Figure 35A:
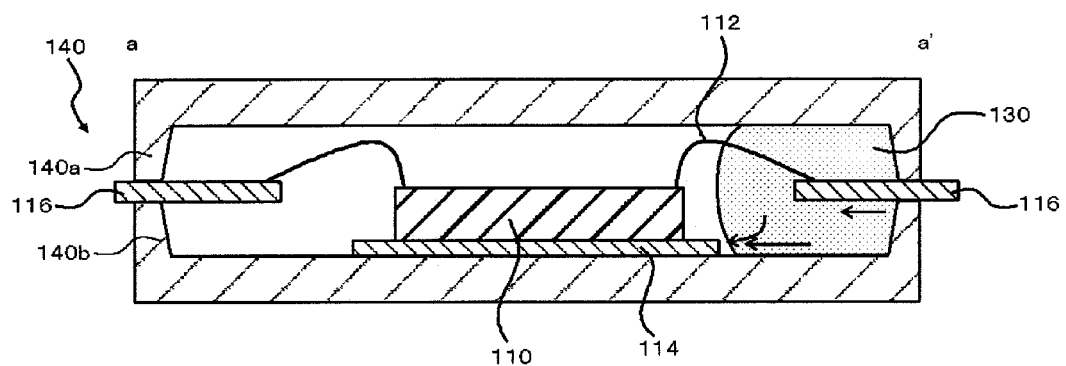
FIGS. 35A and 35B represent cross-sectional views illustrating a mechanism in regard to the manufacturing procedure of the semiconductor device in the case of not having a step portion.
Figure 35B:
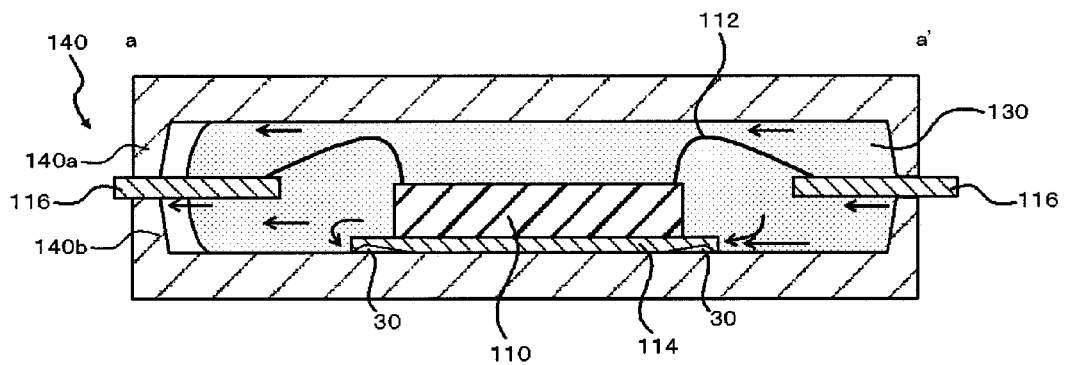

FIG. 35A shows a state immediately before the sealing resin 130 comes into contact with a side surface of the die pad 114. Here, the sealing resin 130 directly collides with one side surface of the die pad 114. Therefore, as shown in FIG. 35B, since the sealing resin 130 flows inside from a lower portion of the one side surface of the die pad 114, resin burr 30 is formed. In addition, as shown in FIG. 35B, the flow of the sealing resin 130 passed above the semiconductor chip 110 also moves around the other side surface of the die pad 114 as it is. Therefore, in regard to the other side surface of the die pad 114, the sealing resin 130 flows from the lower surface, and therefore the resin burr 30 is formed.

On the other hand, in regard to this embodiment, FIGS. 4 and 5A show a state immediately before the sealing resin 130 comes into contact with the step portion 120 in a case where the step portion 120 is formed in the lower mold 140b of the mold 140. In this case, the sealing resin 130 collides with the step portion 120 and therefore swirling of the sealing resin 130 occurs. A flowing mechanism of the sealing resin 130 will be described with reference to FIGS. 10A and 10B.

As shown in FIG. 10A, swirling occurs at a region between the die pad 114 and the step portion 120 after the sealing resin 130 climbs over the step portion 120. At this time, a flowing loss of the sealing resin 130 occurs at a place where the swirling of the sealing resin 130 occurs, and as shown in FIG. 10B, a pressure loss occurs. On the other hand, the flow of the sealing resin 130 becomes substantially uniform at a portion above the step portion 120, and a pressure becomes constant.

In this manner, when the sealing resin 130 climbs over the step portion 120 and comes into contact with the die pad 114, a pressure loss portion is formed between the die pad 114 and the step portion 120. Therefore, the flowing velocity of the sealing resin 130 is diminished. Accordingly, it is possible to mitigate the impact that occurs when the sealing resin 130 collides with the side surface of the die pad 114. Therefore, it is possible to prevent the sealing resin 130 from flowing into the rear surface of the die pad 114 and thereby prevent the resin burr 30 from being formed as shown in FIG. 35.

In addition, when passing above the die pad 114 from the step portion 120, the sealing resin 130 passed above the step portion 120, first, flows into between the step portion 120 and the die pad 114. In this manner, the subsequently flowing sealing resin 130 flows above the region between the step portion 120 and the die pad 114. Therefore, it is possible to prevent the sealing resin 130 from moving around the side surface of the die pad 114 with a high velocity.

On the other hand, when the height of the step portion 120 is lower than that of the outermost edge of the central structure 109, the sealing resin 130 collides with the die pad 114 as it is. Therefore, the impact occurs when the sealing resin 130 collides with the side surface of the die pad 114. Accordingly, the probability of the sealing resin 130 moving around the rear surface side of the die pad 114 becomes high.

Returning to FIGS. 5A and 5B, as shown in FIG. 5B, when passing above the step portion 120 from the die pad 114, the sealing resin 130 passed above the semiconductor resin 110, first, flows into between the die pad 114 and the step portion 120. In this manner, the subsequently flowing sealing resin 130 flows above a region between the die pad 114 and the step portion 120. Therefore, it is possible to prevent the sealing resin 130 from moving around the side surface of the die pad 114 with a high velocity. That is, it is possible to prevent the burr 30 as shown in FIG. 35 from being formed.

Next, after the sealing process with the sealing resin 130, the lead frame 113 in which a plurality of semiconductor devices 100 is connected is taken out from the mold 140. At this time, the sealing resin 130 remaining in the gate 160 connected to the cavity is cut off from one end of the semiconductor device 100.

Here, in this embodiment, in regard to the sealing process, it is possible to suppress the occurrence of the resin burr. On the other hand, in this embodiment, even when the resin burr occurs, only a minute resin burr occurs. In addition, in a case where the minute resin burr occurs, at this stage, a process of removing the resin burr of the sealing resin 130 may be performed.

Next, in the lead frame 113, an outer plated layer (not shown) is formed in a region (external lead 106b, and the rear surface of the die pad 114) not covered with the sealing resin 130. Here, as "the outer plated layer", for example, Sn, and a binary alloy including Sn as a main component are preferable.

Next, in the lead frame 113, the lead terminal 116 and the hanging lead 118 are cut off. At this time, in regard to the lead terminal 116, one end connected to a supporting frame (not shown) of the lead frame 113 is cut off with the external lead 116b exposed from the sealing resin 130 remained. In addition, in regard to the hanging lead 118, a portion exposed from the sealing resin 130 is cut off. Next, for the mounting on a circuit board (not shown), a part of the lead terminal 116 exposed from the sealing resin 130 is bent.

As described above, it is possible to obtain the semiconductor device 100.

Next, an effect of the first embodiment will be described.

The exposed die pad-type package may be obtained by a method of covering the rear surface of the die pad 114 with a tape during the sealing with the sealing resin 130. This method is applied to a package such as a Quad Flat Non-leaded Package (QFN) in which the lead terminal 116 is not exposed to the outside of the sealing resin 130.

However, in the case of a Quad Flat Package (QFP) or the like in which the lead terminal 116 is exposed to the outside, the method using the tape may not be applied. Therefore, a method where the mold 140 is disposed in such a manner that the rear surface of the die pad 114 is brought into contact with one plane of the mold 140 is used. In this method, during the sealing with the sealing resin 130, the sealing resin 130 may move around the rear surface of the die pad 114.

On the other hand, according to the first embodiment, the step portion 120 disposed to be parallel with at least a first side of the outermost edge of the central structure 109 and a second side adjacent to the first side is formed in one plane of the mold 140. In this manner, during the sealing with the sealing resin 130, it is possible to diminish the flowing velocity of the sealing resin 130 when the sealing resin 130 collides with the side surface of the die pad 114. Therefore, it is possible to prevent the sealing resin 130 from flowing into the rear surface of the die pad 114, and thereby prevent the resin burr from being formed.

As described above, according to the first embodiment, it is possible to prevent the resin burr from being formed on the rear surface of the die pad with a simple procedure. In addition, even when the resin burr is formed, it is possible to make the resin burr small. For example, the first embodiment may be suitably applied to a package such as the QFP.

Second Embodiment

Figure 11:
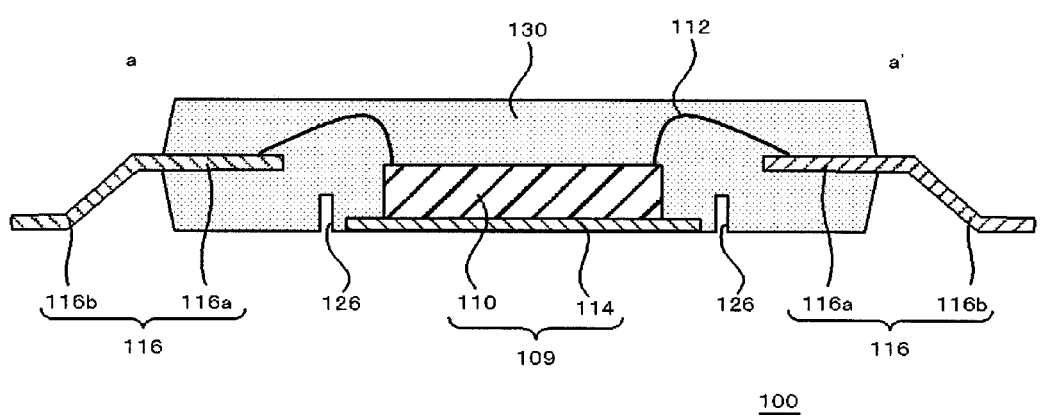
FIG. 11 represents a cross-sectional view illustrating an example of a configuration of a semiconductor device according to a second embodiment.
Figure 12:
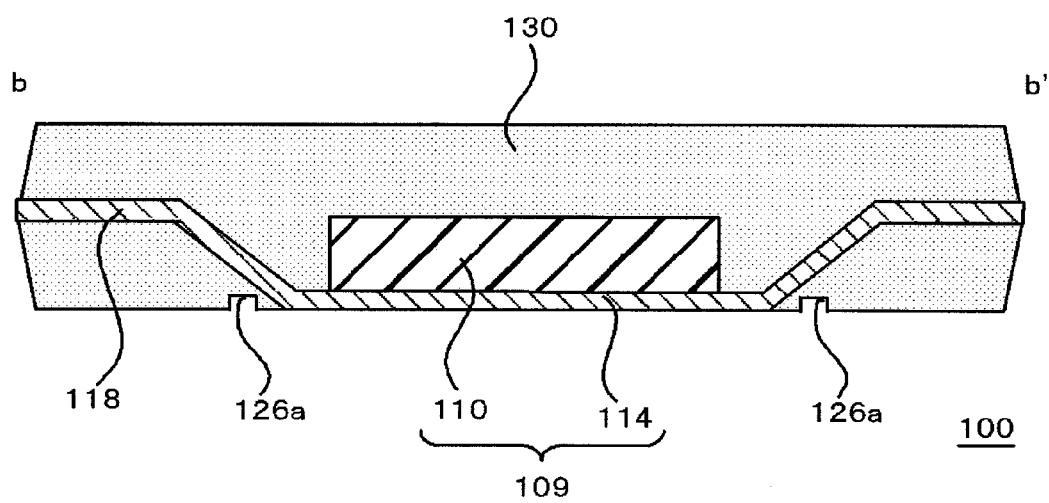
FIG. 12 represents a cross-sectional view illustrating an example of the configuration of the semiconductor device according to the second embodiment.

FIGS. 11 and 12 represent cross-sectional views illustrating an example of a configuration of a semiconductor device 100 according to a second embodiment. FIG. 11 represents a cross-sectional view taken along an a-a' line of FIG. 13 described below. FIG. 12 represents a cross-sectional view taken along a b-b' line of FIG. 13.

The second embodiment is similar to the first embodiment except for the concave portion 126 as described below. The concave portion 126, which is disposed to be parallel with at least one first side of an outermost edge of the central structure 109 and a second side adjacent to the first side, respectively, is formed in the one plane of the sealing resin 130. Here, in the concave portion 126, a depth of the concave portion (concave portion 126a) at a location under the hanging lead 118 is shallower than that at a location other than the location under the hanging lead 118. Hereinafter, the details of this configuration will be described.

As shown in FIG. 11, the concave portion 126 that is disposed with a predetermined distance from the die pad 114 (central structure 109) is formed in the sealing resin 130 at the rear side of the die pad 114. In the second embodiment, the depth of the concave portion 126 is not particularly limited, but the height may be equal to or greater than or may be equal to or less than that of the outermost edge of the central structure 109. In FIG. 11, there is shown a case where for example, the depth of the concave portion 126 is equal to or greater than the height of the outermost edge of the central structure 109.

As shown in FIG. 12, in the concave portion 126, the depth of the concave portion (hereinafter, referred to as a concave portion 126a) at a location under the hanging lead 118 is shallower than that at a location (concave portion 126 in FIG. 11) other than the location under the hanging lead 118. In this manner, the concave portion 126 may be disposed as close as possible to the die pad 114.

In addition, the depth of the concave portion 126a at the location under the hanging lead 118 may be deep in such a manner that a corner portion of the concave portion 126a substantially comes into contact with the hanging lead 118. In addition, the corner portion of the concave portion 126a only needs to be close to the hanging lead 118, and it is not necessary to come into contact with the hanging lead 118. In this manner, it is possible to diminish an inflow velocity of the sealing resin 130 from the extending direction of the hanging lead 118 during the sealing with the sealing resin 130.

Figure 13:
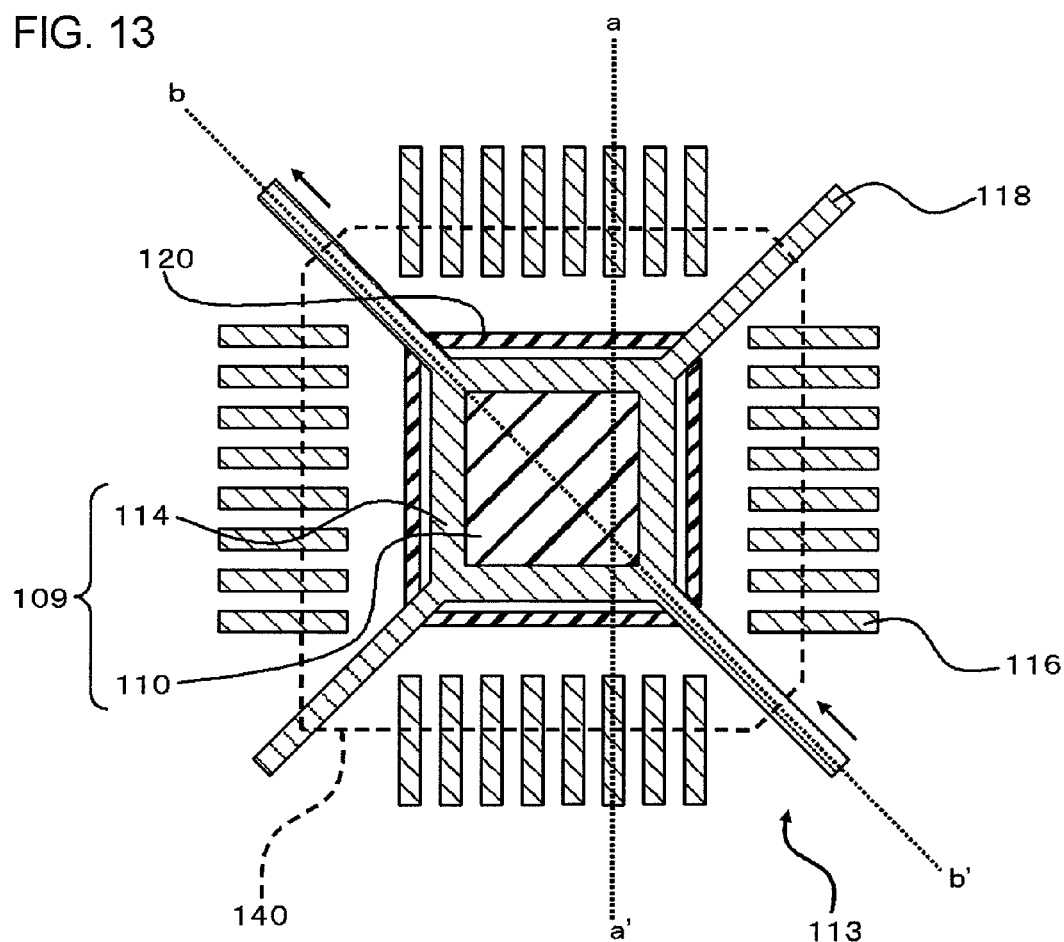
FIG. 13 represents a plan view illustrating an example of the configuration of the semiconductor device and a mold according to the second embodiment.
Figure 14:
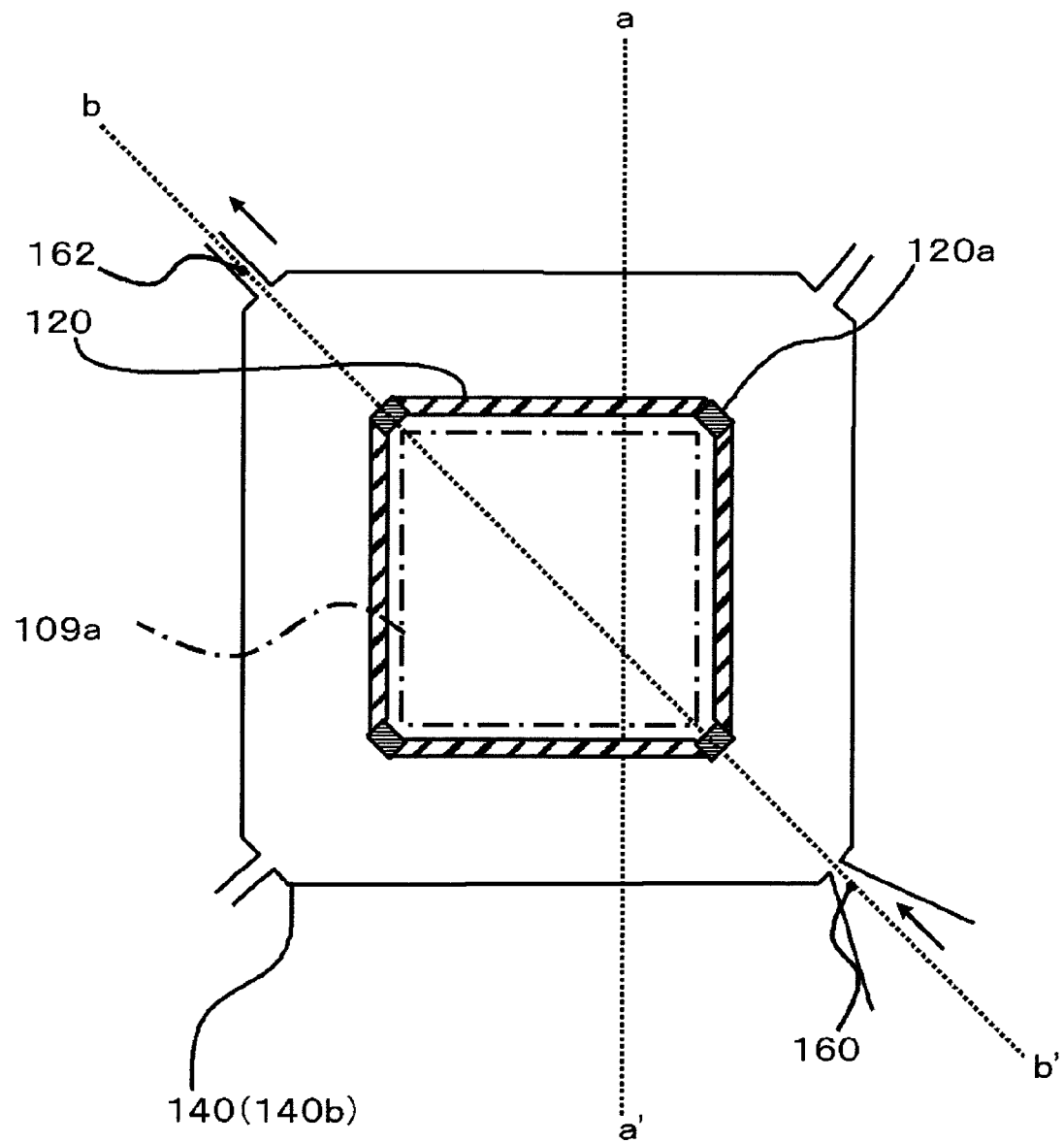
FIG. 14 represents a plan view illustrating a configuration of the lower mold according to the second embodiment.

Next, a method of manufacturing the semiconductor device 100 according to the second embodiment will be described using FIGS. 13 and 14. FIG. 13 represents a plan view illustrating an example of a configuration of the semiconductor device 100 and the mold 140 according to the second embodiment. FIG. 14 represents a plan view illustrating a configuration of the lower mold 140b according to the second embodiment.

As shown in FIG. 13, in a disposing process in the mold, the lead frame 113 is disposed in such a manner that the rear surface of the die pad 114 comes into contact with one plane of the lower mold 140b. The step portion 120 is continuously formed to be parallel with the entirety of the outermost edge of the central structure 109 similarly to the first embodiment.

As shown in FIG. 14, the step portion 120a is formed at a location under the hanging lead 118. In addition, the height of the step portion 120a at the location under the hanging lead 118 is lower than that at a location (step portion 120) other than the location under the hanging lead 118.

In addition, for example, in a plan view, the step portion 120a is curved from a portion brought into contact with the step portion 120 in a direction orthogonal to the extending direction of the hanging lead 118. In addition, a length of the step portion 120a in the direction orthogonal to the extending direction of the hanging lead 118 is substantially equal to a width of the hanging lead 118. Specifically, the length of the step portion 120a is longer than the width of the hanging lead 118, for example, by a length equal to or greater than 0.3 mm and equal to or less than 1 mm. In this manner, in the disposing process in the mold, the hanging lead 118 does not ride on the step portion 120. That is, it is possible to fit the hanging lead 118 into a location of the step portion 120a whose both sides are interposed by the step portion 120.

According to the second embodiment, the height of the step portion 120 at a location (step portion 120a) under the hanging lead 118 is lower than that at a location other than the location under the hanging lead 118. In this manner, it is possible to continuously form the step portion 120 to be parallel with the entirety of the outermost edge of the central structure 109 and it is possible to make the step portion 120 close to the outermost edge of the central structure 109. Therefore, it is possible to diminish the flowing velocity of the sealing resin 130 at a range immediately close to the die pad 114 where it is easy for the resin to flow into the rear surface of the die pad 114 during the sealing with the sealing resin 130.

Third Embodiment

Figure 15:
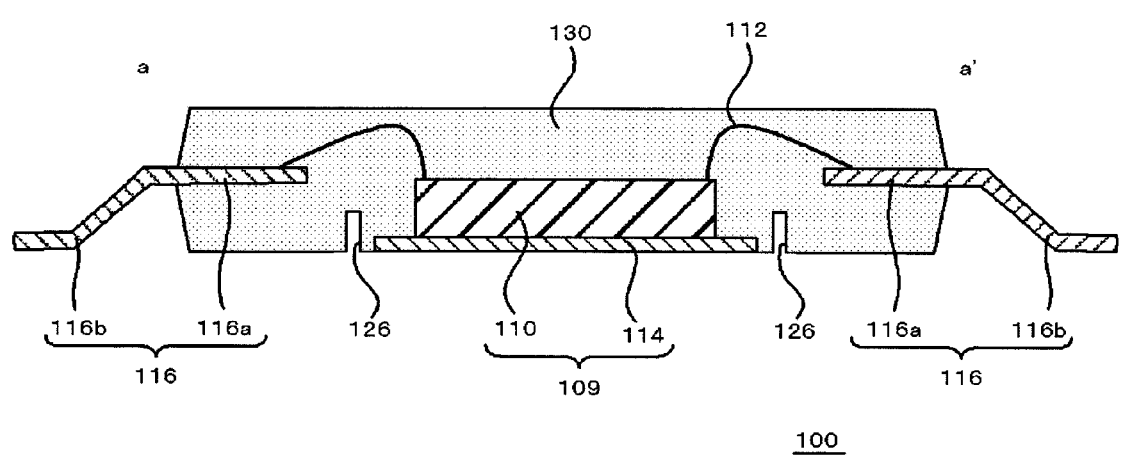
FIG. 15 represents a cross-sectional view illustrating an example of a configuration of a semiconductor device according to a third embodiment.
Figure 16:
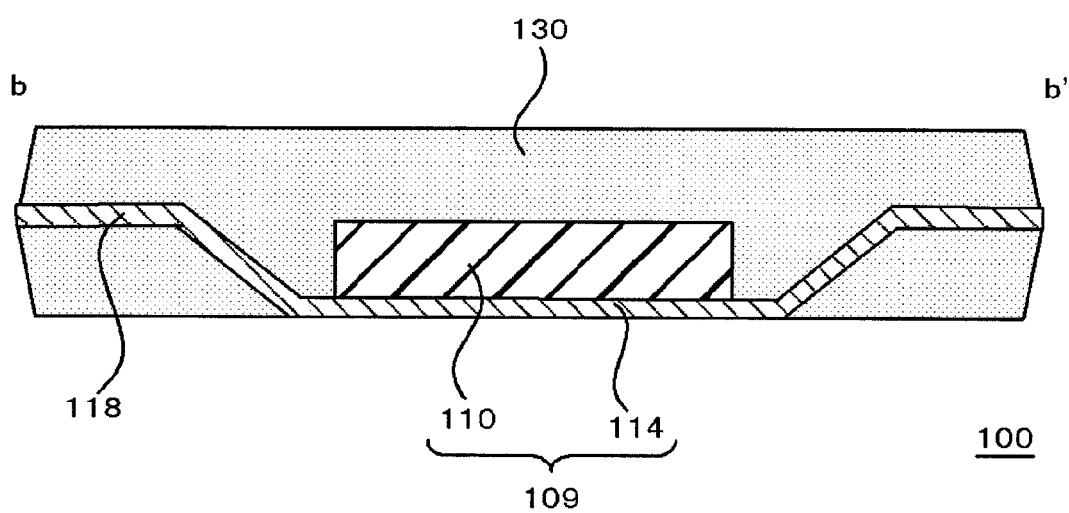
FIG. 16 represents a cross-sectional view illustrating an example of the configuration of the semiconductor device according to the third embodiment.

FIGS. 15 and 16 represent cross-sectional views illustrating an example of a configuration of a semiconductor device 100 according to a third embodiment. FIG. 15 represents a cross-sectional view taken along an a-a' line of FIG. 17 described below. FIG. 16 represents a cross-sectional view taken along a b-b' line of FIG. 17.

The third embodiment is similar to the second embodiment except that the concave portion 126 is not formed at a location under the hanging lead 118. Hereinafter, the details of this configuration will be described.

As shown in FIG. 15, similarly to the second embodiment, the concave portion 126 is formed in the sealing resin 130 at the rear side of the die pad 114.

As shown in FIG. 16, the concave portion 126 is not formed at a location under the hanging lead 118. In this manner, it is possible to dispose the concave portion 126 closer to the die pad 114 compared to the second embodiment.

Figure 17:
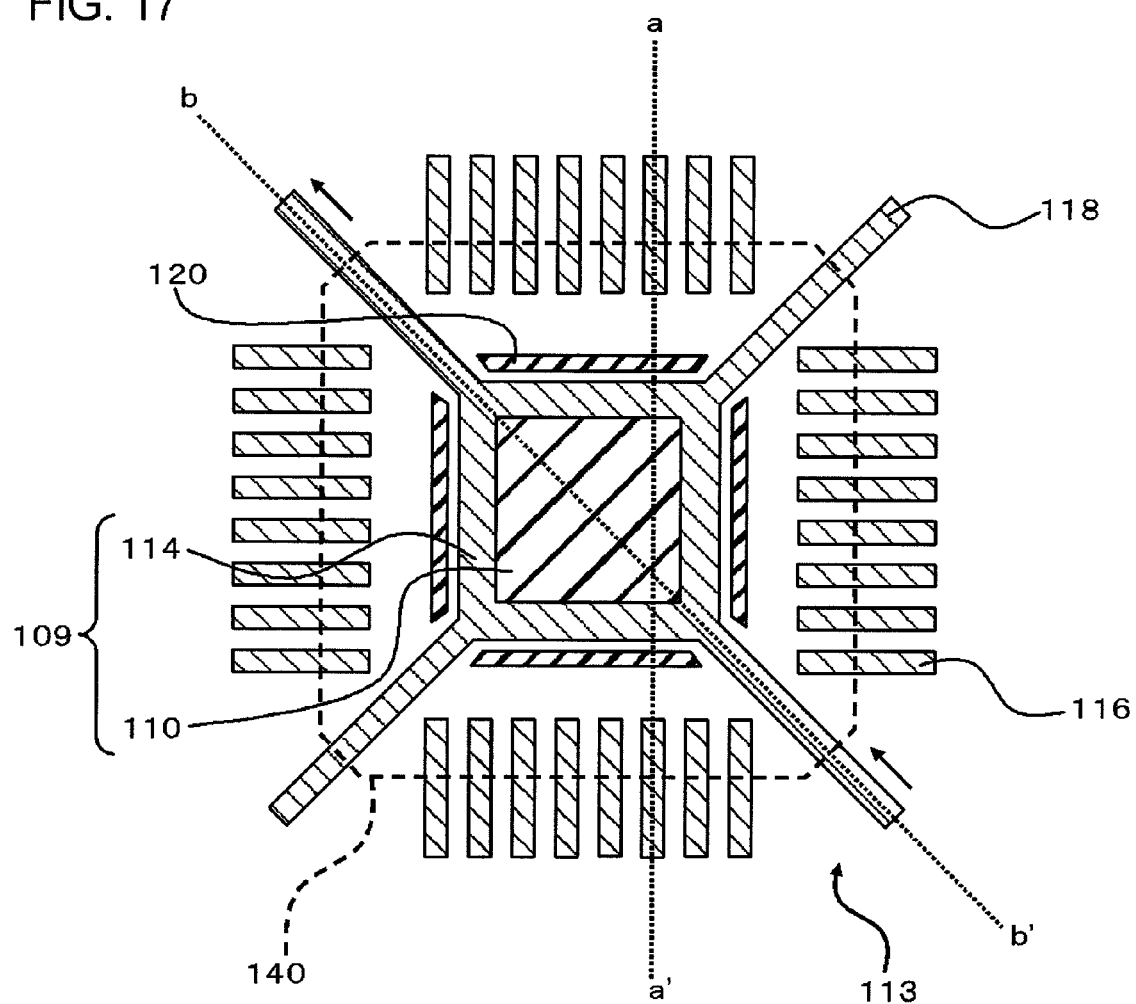
FIG. 17 represents a plan view illustrating an example of a configuration of the semiconductor device and a mold according to the third embodiment.
Figure 18:
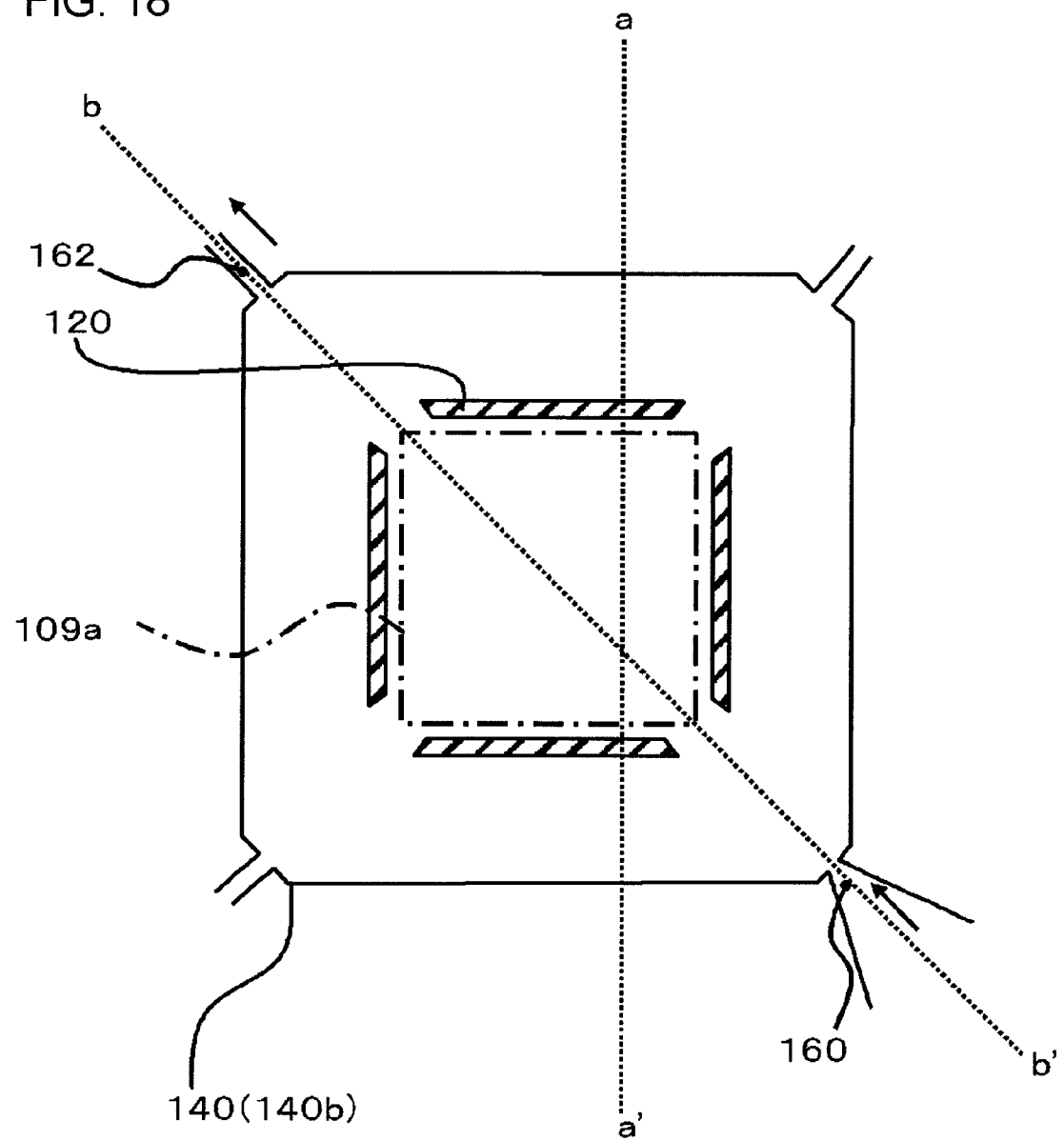
FIG. 18 represents a plan view illustrating a configuration of a lower mold according to the third embodiment.

Next, a method of manufacturing the semiconductor device 100 according to the third embodiment will be described using FIGS. 17 and 18. FIG. 17 represents a plan view illustrating an example of a configuration of the semiconductor device 100 and the mold 140 according to the third embodiment. FIG. 18 represents a plan view illustrating a configuration of the lower mold 140b according to the third embodiment.

As shown in FIG. 17, in a disposing process in the mold, the lead frame 113 is disposed in such a manner that the step portion 120 is parallel with each side of the outermost edge of the central structure 109. At this time, the step portion 120 is not formed at a location under the leading lead 118.

As shown in FIG. 18, the step portion 120 has a side surface parallel with the hanging lead 118 in an extending direction thereof. In addition, in a direction orthogonal to the extending direction of the hanging lead 118, a length of a portion where the step portion 120 is not formed is substantially equal to a width of the hanging lead 118. Specifically, the length of a portion where the step portion 120 is not formed is longer than the width of the hanging lead 118, for example, by a length equal to or greater than 0.3 mm and equal to or less than 1 mm. In this manner, in the disposing process in the mold, the step portion 120 does not ride on the step portion 120.

According to the third embodiment, the step portion 120 is not formed at a location under the hanging lead 118. In this manner, it is possible to make the step portion 120 further closer to the outermost edge of the central structure 109.

Fourth Embodiment

Figure 19:
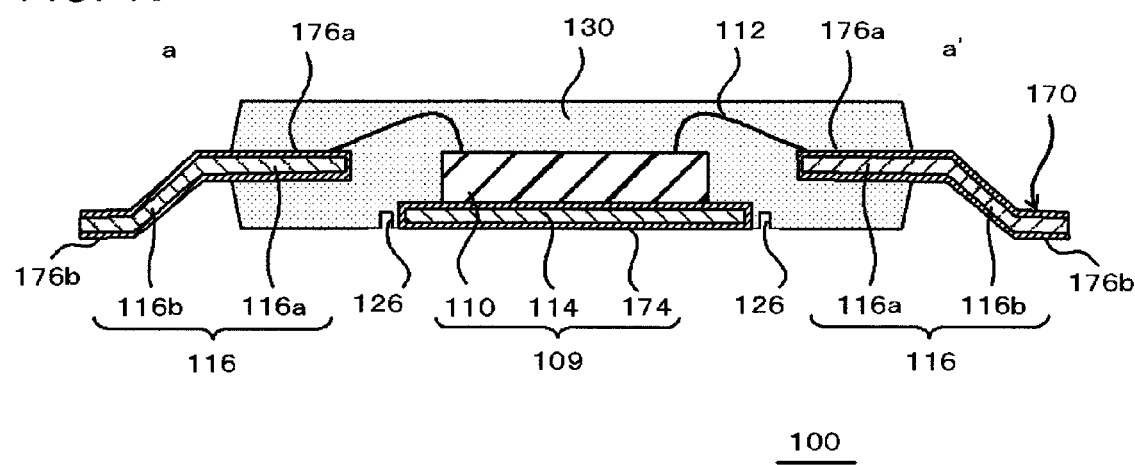
FIG. 19 represents a cross-sectional view illustrating an example of a configuration of a semiconductor device according to a fourth embodiment.

FIG. 19 represents a cross-sectional view illustrating an example of a configuration of the semiconductor device according to a fourth embodiment. The fourth embodiment is similar to the second embodiment except for the following points. An end portion of the lead terminal 116 at the side of the die pad 114 has a first plated layer 176a. In addition, the die pad 114 has a second plated layer 174 at the rear surface thereof. Here, the first and second plated layers 176a and 174 are made of the same material as each other. Hereinafter, the details of this configuration will be described.

As shown in FIG. 19, in the fourth embodiment, for example, the same plated layer 170 is formed in all regions of the lead frame 113 except for a cut plane of the external lead 116b. In the following description, "first plated layer 176a", "second plated layer 174", and "third plated layer 176b" represent a part of the same plated layer 170, respectively. As described above, the same plated layer 170 is formed on the entire surface of the lead frame 113, such that the patterning of the plated layer is not necessary. That is, in a process of preparing the lead frame 113 (S210) described below, it is possible to reduce the cost of a mask for plating.

As the plated layer 170, for example, a multi-layered plated layer including a Pd layer may be exemplified. Specifically, the plated layer 170 has, for example, a three-layers structure where Ni, Pd, and Au are laminated in this order. In addition, a surface side of the plated layer 170 is made of Au. The plated layer 170 composed of these materials has a bonding property and a solder adhesion property, both being excellent.

In addition, in a case where the plated layer 170 includes Pd, it is expensive, such that it is preferable that the plated layer 170 be thin. Specifically, a thickness of the plated layer 170 is, for example, 2 µm or less. Accordingly, the above-described plated layer 170 has a high melting point and is thin, such that the plated layer 170 has little adverse effect on the flowing of the sealing resin 130.

As shown in FIG. 19, in the lead terminal 116, an end portion of the internal lead 116a has the first plated layer 176a. In addition, in regard to the internal lead 116a of the lead terminal 116, the first plated layer 176a is provided on a plane connected to the bonding wire 112. In this manner, it is possible to improve an adhesion property at the time of connecting the bonding wire 112 to the internal lead 116a.

In addition, in the lead terminal 116, an end portion of the external lead 116b may have the third plated layer 176b. In addition, in the lead terminal 116, the third plated layer 176b is provided to the end portion of the external lead 116b at a mounting side with respect to a circuit board (not shown) or the like. In this manner, it is possible to improve a solder adhesion property at the time of the mounting to the circuit board or the like.

In addition, the die pad 114 has the second plated layer 174 at the rear surface thereof. In this manner, it is possible to improve a solder adhesion property to the rear surface of the die pad 114 at the time of the mounting to the circuit board or the like.

In addition, it is preferable that at least the first and second plated layers 176a and 174 be made of the same material as each other. In addition, the third plated layer 176b may be made of the same material as that of the first and second plated layers. As described above, the first and second plated layers 176a and 174 include, for example, a Pd layer. In this manner, the first and second plated layers 176a and 174 have the bonding property and the solder adhesion property, both being excellent.

As described above, in regard to the fourth embodiment, a case where the plated layer 170 is formed on the entire surface of the lead frame 113 is described, but the first, second, and third plated layers 176a, 174, and 176b may be patterned.

Next, a method of manufacturing the semiconductor device 100 according to the fourth embodiment will be described using FIGS. 20A and 20B. FIGS. 20A and 20B represent flow charts illustrating a method of manufacturing the semiconductor according to a comparative example and the fourth embodiment. FIG. 20A illustrates the comparative example. On the other hand, FIG. 20B illustrates the fourth embodiment.

In the fourth embodiment, the displacing process in the mold is performed in a state where the plated layer 170 is formed on the entire surface of the lead frame 113. That is, the first plated layer 176a is provided to the end portion of the lead terminal 116 at the side of the die pad 114, and the second plated layer 174 is provided to the rear surface of the die pad 114. At this time, the above-described first and second plated layers 176a and 174 are formed of the same material. Hereinafter, the details of this configuration will be described.

First, the comparative example will be described by using FIG. 20A. In addition, the mold 140 of the comparative example does not have the step portion 120 like this embodiment. In addition, in the comparative example, an inner plating and an outer plating are performed by separate processes.

First, a lead frame 113 to which the first plated layer 176a (inner plating) is provided to an end portion of the lead terminal 116 at the side of the die pad 114 is prepared (S110).

The first plated layer 176a in the comparative example includes, for example, Ag. In addition, in S110, the outer plating is not performed, and the second plated layer 174 is not formed.

Next, the semiconductor chip 110 is mounted on the die pad 114 of the lead frame 113. Next, the lead frame 113 on which the semiconductor chip 110 is mounted (semiconductor chip structure) is disposed in the mold 140 (disposing process in a mold). Next, the semiconductor chip structure is sealed with the sealing resin 130 (S120).

The mold 140 of the comparative example does not have the step portion 120 like this embodiment, such that the resin burr 30 occurs at the rear surface of the die pad 114. Accordingly, the resin burr 30 occurring at the rear surface of the die pad 114 is removed after the sealing with the sealing resin (S130).

In addition, in the process of removing the resin burr 30 (S130), for example, the following process is performed. First, the resin burr 30 is subjected to an electrolytic degreasing by an alkali solution of NaOH, NaPO$_3$, or the like. At this time, an electric field may be applied by using the lead frame 113 as a cathode. In this manner, a coated layer insoluble in water such as oil and fat content is removed from a surface of the lead frame 113 exposed from the sealing resin 130.

Next, a thin etching is performed with respect to the rear surface the die pad 114 using a metallic etchant. In this manner, an oxide film, a machining layer, a minute claw, or the like are removed.

Next, the resin burr 30 is physically removed. For example, a water jetting that blows out a highly pressurized water, or a dry blasting that blows out beads, or the like may be exemplified. In this manner, the resin burr 30 is removed.

Next, a portion to which the plating is not performed is masked, and the second plated layer 174 is formed on the rear surface of the die pad 114 (outer plating: S140). At the same time, the third plated layer 176b is provided to an end portion of the lead terminal 116 at the side exposed from the sealing resin 130. In addition, the second and third plated layers 174 and 176b in the comparative example are formed of, for example, Sn.

Next, in the lead frame 113, the lead terminal 116 and the hanging lead 118 are cut off. In addition, the external lead 116b is bent (lead processing: S150).

As described above, in the method of the comparative example, the inner plating and the outer plating are performed separately.

Next, a method of manufacturing the semiconductor device 100 according to fourth embodiment will be described using FIG. 20B.

First, the lead frame 113 to which a Pre Plate Frame (PPF) plating is performed is prepared (S210). At this time, inner plating and outer plating are completed. As described above, the first, second, and third plated layers 176a, 174, and 176b are plated with the same material. Here, for example, Ni, Pd and Au are laminated on the entire surface of the lead frame 113 in this order, and thereby the plated layer 170 is formed. In addition, since a plating including Pd is performed in advance, this lead frame 113 is called Pd-Pre-Plated Frame (Pd-PPF).

Next, the semiconductor chip 110 is mounted on the die pad 114 of the lead frame 113 and then is sealed with the sealing resin 130 (S220). At this time, since the mold 140 has the step portion 120, the resin burr 30 does not occur on the rear surface of the die pad 114. Accordingly, even when the resin burr 30 occurs, the size thereof becomes minute.

Next, a process of removing the minute resin burr 30 that occurs is performed (S230). At this time, the resin burr 30 has a minute size, such that the resin burr 30 may be removed under a weak removing condition. For example, in regard to the alkali electrolytic degreasing, an immersion time may be shortened. In addition, a temperature of the alkali may be low. Therefore, the plated layer 170 including the first, second, and third plated layers 176a, 174, and 176b may be formed of a material that is weak with respect to the alkali electrolytic degreasing.

Here, for example, the Pd-PPF or the like is weak to the alkali solution. Therefore, in regard to the alkali electrolytic degreasing, an interface where the side surface of the die pad 114 and the sealing resin 130 come into contact with each other may be peeled off. Accordingly, it is preferable that the fourth embodiment be applied to the case of Pd-PPF or the like, particularly.

Next, in the lead frame 113, the lead terminal 116 and the hanging lead 118 are cut off. In addition, the external lead 116b is bent (lead processing: S240)

Next, an effect of the fourth embodiment will be described while being compared with the comparative example.

In the method of the comparative example, the mold 140 does not have the step portion 120. Therefore, a large resin burr 30 may occur at the periphery of the die pad 114. Accordingly, a process of removing the resin burr 30 under a strong condition (S130) is necessary.

In regard to the process of removing the resin burr 30 (S130), in the case of the strong condition, a heat-resistance property of the semiconductor 100 may be weak. Therefore, for example, at the time of the mounting on the circuit board, when a temperature of a reflow or the like is raised, an interface of the sealing resin 130, and the die pad 114 or the semiconductor chip 110 may be peeled off due to a thermal stress.

In addition, in the method of the comparative example, the process of removing the resin burr 30 (S130) is performed, such that the outer plating has to be performed after this process (S130). Therefore, the inner plating and the outer plating are performed by separate processes. Accordingly, the number of processes increases, and the manufacturing cost may be increased.

On the other hand, according to the fourth embodiment, the mold 140 has the step portion 120 similarly to the second embodiment. Therefore, as the same effect as the second embodiment, the resin burr 30 does not occur. Accordingly, the process of removing the resin burr 30 (S240) may be omitted. In addition, the process of removing the resin burr 30 (S240) may be performed under a weak condition. Accordingly, the heat-resistance property of the semiconductor device 100 is not deteriorated.

In addition, according to the fourth embodiment, the lead frame 113 to which the PPF plating is performed in advance is prepared. That is, the sealing process with the sealing resin 130 (S220) is performed in a state where the first and second plated layers 176a and 174 are formed. At this time, the above-described first and second plated layers 176a and 174 are formed of the same material. Therefore, the outer plating may be omitted. Accordingly, the number of manufacturing processes may be decreased, and therefore the manufacturing cost may be lowered.

In addition, according to the fourth embodiment, the following effects are obtained. The plated layer 170 in the above-described Pd-PPF is formed to be thin. Therefore, in the case of using the PD-PPF, when the sealing burr 30 occurs at the rear surface of the die pad 114, the distance between the rear surface of the die pad 114 and the circuit board becomes wide. Accordingly, it may be difficult to adhere the die pad 114 to the circuit board using a solder. On the other hand, according to the fourth embodiment, the resin burr 30 is suppressed from occurring at the rear surface of the die pad 114. Accordingly, in the case of the Pd-PPF, it is possible to obtain a good solder adhesion property at the rear surface side of the die pad 114.

Figure 21:
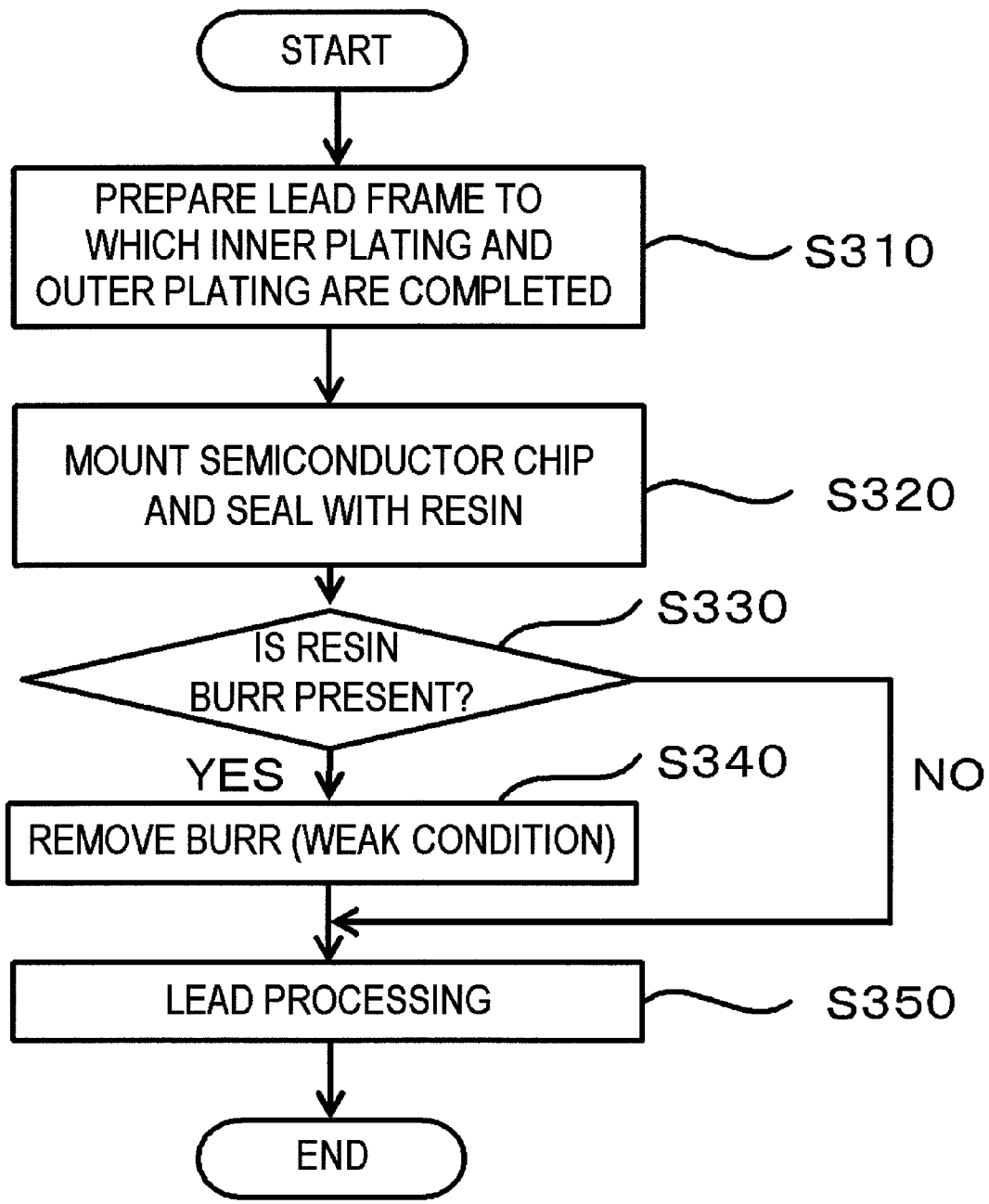
FIG. 21 represents a flow chart illustrating a modification of the fourth embodiment.

In addition, in the fourth embodiment, as shown in FIG. 21, a process of confirming whether or not the resin burr 30 is present (S330) may be performed. FIG. 21 represents a flow chart illustrating a modification of the fourth embodiment.

In the modification, after the sealing process (S320), it is confirmed that the resin burr 30 is present (S330). In a case where the resin burr 30 is present (Yes in S330), the burr removing process under the weak condition is performed (S340).

On the other hand, in a case where the resin burr is not present (No in S330), the burr removing process is omitted, a lead processing process (S350) is immediately performed.

As described above, the process of confirming whether or not the resin burr 30 is present (S330) may be performed.

Fifth Embodiment

Figure 22:
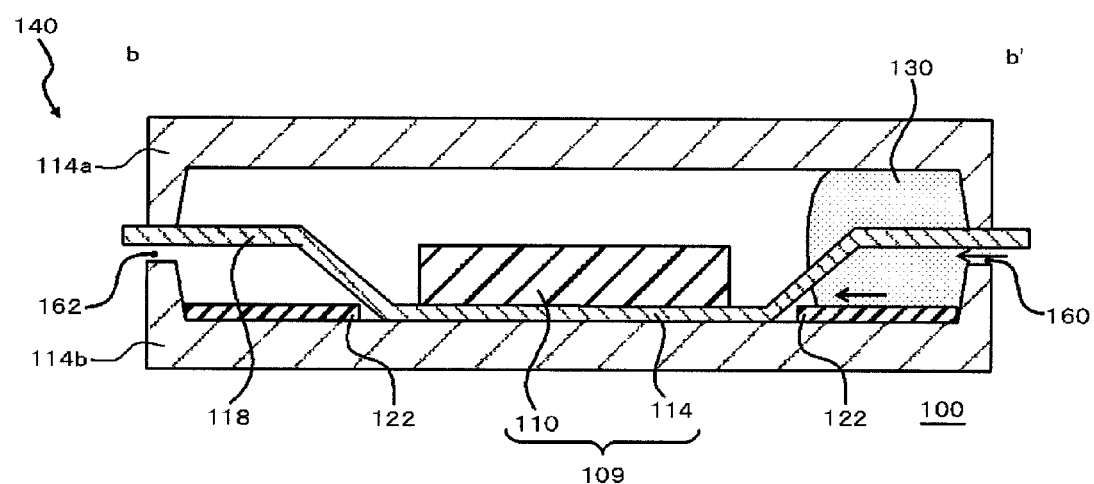
FIG. 22 represents process cross-sectional view illustrating an example of a manufacturing procedure of a semiconductor device according to a fifth embodiment.
Figure 23A:
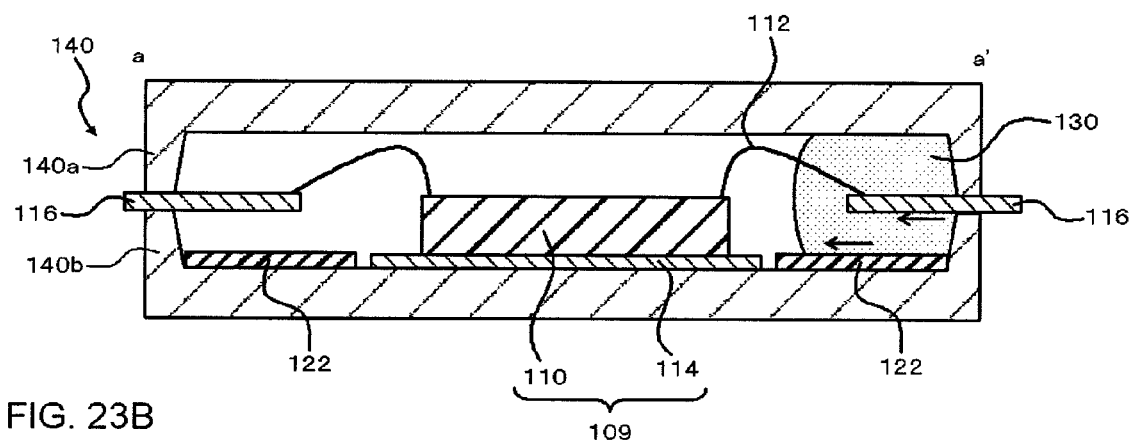
FIGS. 23A and 23B represent process cross-sectional views illustrating an example of a manufacturing procedure of the semiconductor device according to the fifth embodiment.
Figure 23B:
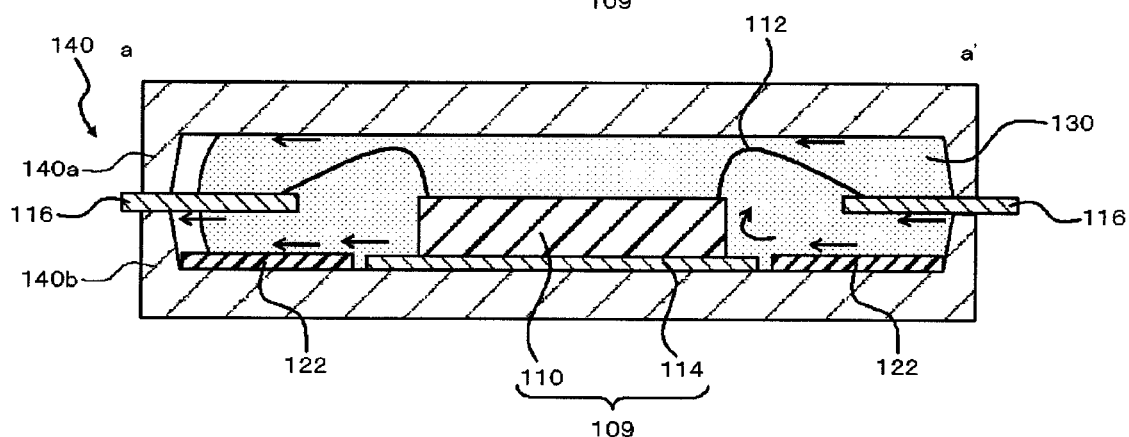
Figure 24:
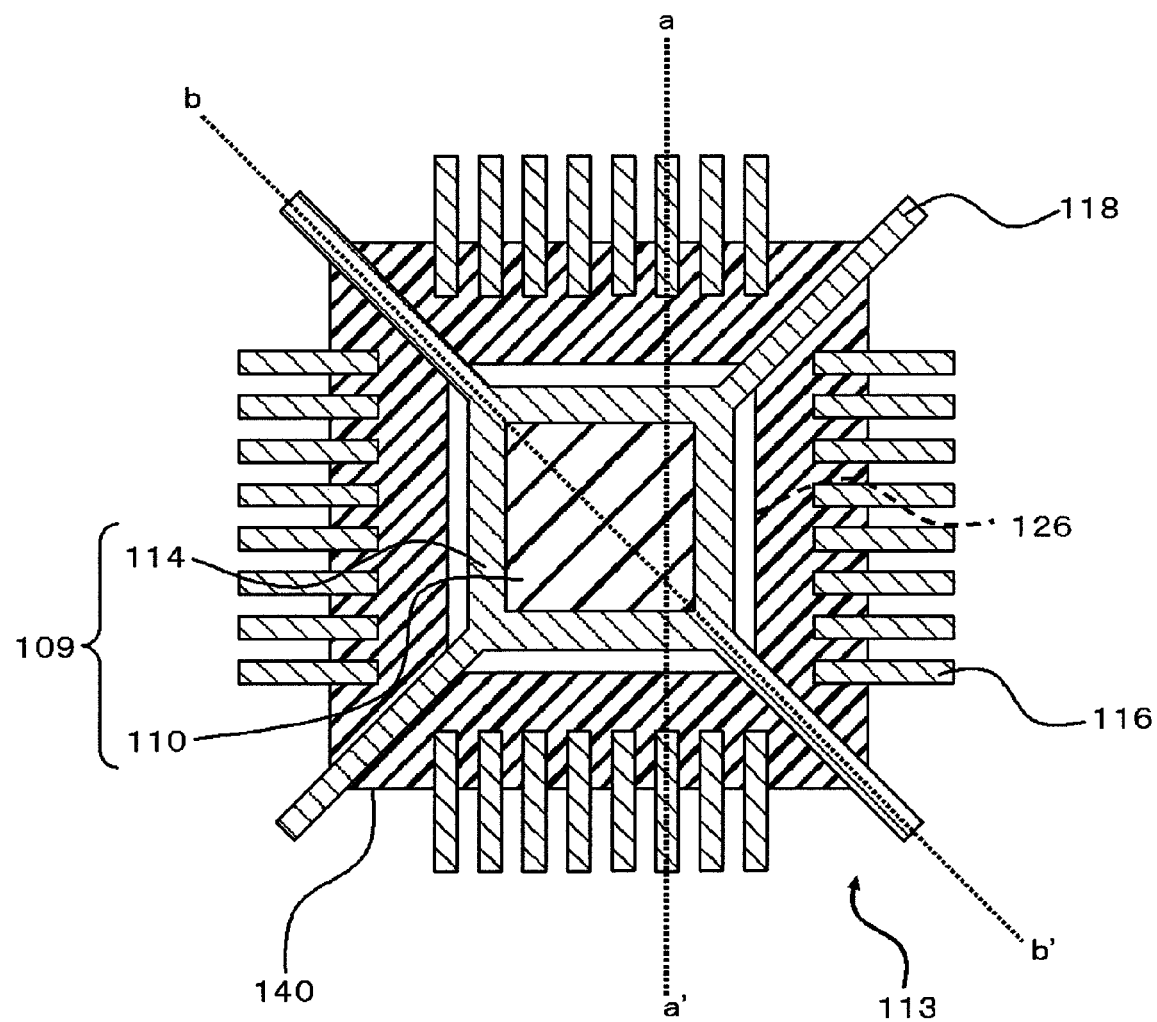
FIG. 24 represents a plan view illustrating an example of a configuration of the semiconductor and a mold according to the fifth embodiment.

FIGS. 22, 23A and 23B represent process cross-sectional views illustrating a manufacturing procedure of the semiconductor device according to this embodiment. FIG. 24 represents a plan view illustrating an example of a configuration of the semiconductor device 100 and the mold 140 in the manufacturing procedure shown in FIGS. 22, 23A, and 23B. FIG. 22 is a cross-sectional view taken along a b-b' line of FIG. 24 and FIGS. 23A and 23B are cross-sectional view taken along an a-a' line of FIG. 24.

In this embodiment, a shape of a step portion 122 formed in a surface (one plane) of the lower mold 140b is different from that of the step portion 120 of the first embodiment. In this embodiment, the step portion 122 is also configured to be disposed at the periphery of the central structure 109 with a predetermined distance from the outermost edge of the central structure 109 along each side of the outermost edge of the central structure 109 and to have the height equal to or greater than that of the outermost edge of the central structure 109, when the die pad 114 of the lead frame 113 and the semiconductor chip 110 mounted on the die pad 114 are disposed on the surface of the lower mold 140b. Similarly to the first embodiment, in this embodiment, the outermost edge of the central structure 109 is the same as the outer edge of the die pad 114, such that the step portion 122 may be configured to be disposed at the periphery of the die pad 114 with a predetermined distance from the die pad 114 along each side of the outer edge of the die pad 114. In addition, the height of the step portion 122 may be equal to or greater than the height of the die pad 114 similarly to the step portion 120.

However, this embodiment is different from the step portion 120 in the first embodiment in that the step portion 122 is formed to extend to the outer edge of the cavity of the lower mold 140b.

Figure 25:
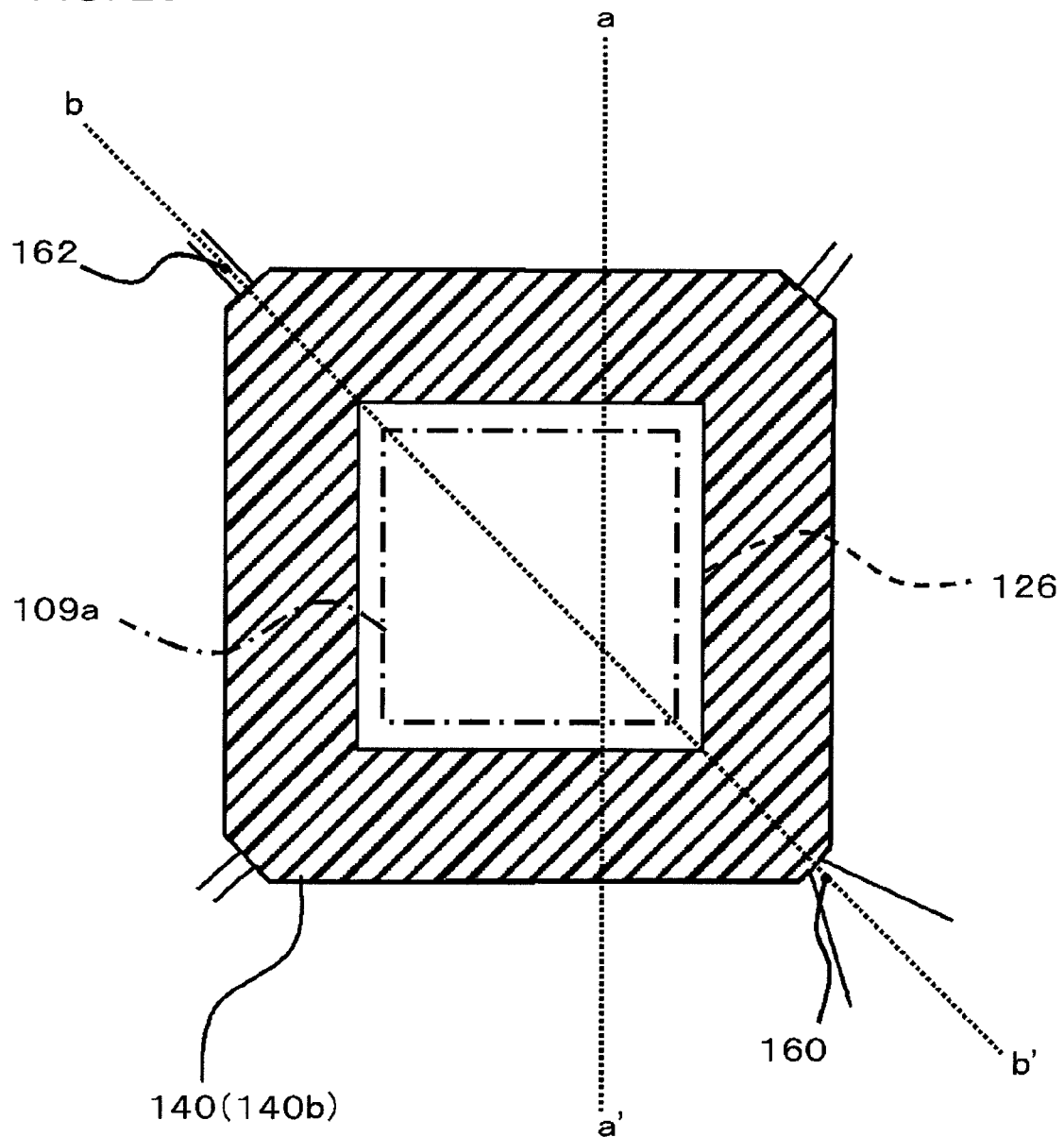
FIG. 25 represents a plan view illustrating an example of a configuration of a lower mold according to the fifth embodiment.

FIG. 24 represents a plan view illustrating an example of a configuration of the semiconductor device 100 and the mold 140 in regard to the manufacturing procedure according to this embodiment. FIG. 25 represents a plan view illustrating a configuration of the inside of a cavity of the lower mold 140b. In this embodiment, the step portion 122 is formed to surround the outer edge of the central structure 109 in such a manner that a concave portion having a predetermined width is formed at the periphery of the entire outermost edge of the central structure 109 (outermost edge 109a of the central structure).

By such a configuration, when the sealing resin 130 introduced from the gate 160 passes above the die pad 114 from above the step portion 122, first, it flows into between the step portion 122 and the die pad 114. In this manner, the subsequently flowing sealing resin 130 flows above the region between the step portion 122 and the die pad 114. Therefore, it is possible to prevent the sealing resin 130 from moving around the side surface of the die pad 114 with a high velocity, and thereby to prevent the resin burr 30 shown in FIG. 35 from being formed.

Figure 26:
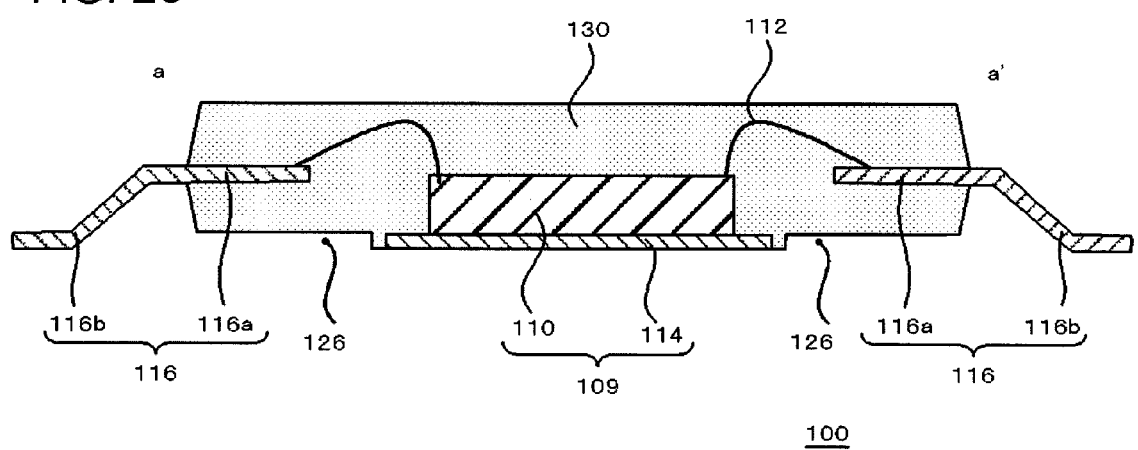
FIG. 26 represents a cross-sectional view illustrating an example of the configuration of the semiconductor device according to the fifth embodiment.
Figure 27:
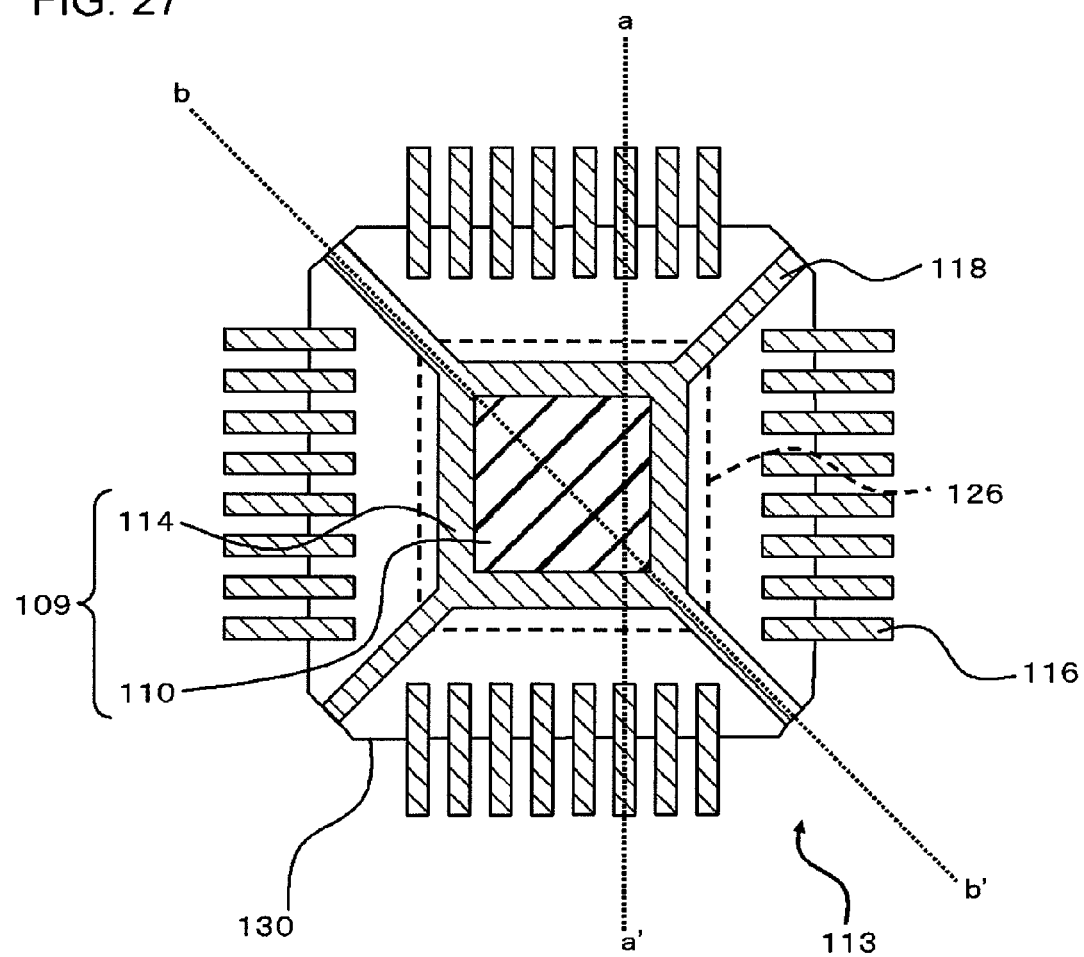
FIG. 27 represents a plan view illustrating an example of the configuration of the semiconductor device according to the fifth embodiment.
Figure 28:
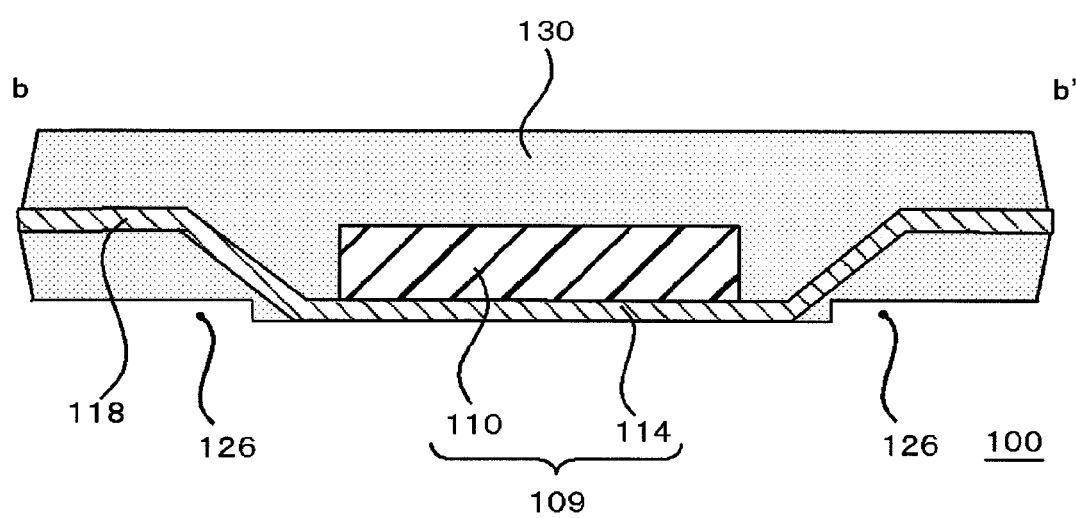
FIG. 28 represents a cross-sectional view taken along a line b-b' of FIG. 27.

FIG. 26 represents a cross-sectional view illustrating an example of a configuration of a semiconductor device 100 according to the embodiment of the invention. FIG. 27 represent a plan view illustrating an example of a configuration of the semiconductor device 100 according to the embodiment of the invention. FIG. 26 is a cross-sectional view taken along an a-a' line of FIG. 27. FIG. 28 represents a cross-sectional view taken along a b-b' line of FIG. 27.

In this embodiment, as described above with reference to FIGS. 22 to 25, the step portion 122 is formed to extend to the outer edge of the cavity of the lower mold 140b, such that the concave portion 126 is also formed to extend to the outer edge of the sealing resin 130.

Figure 29:
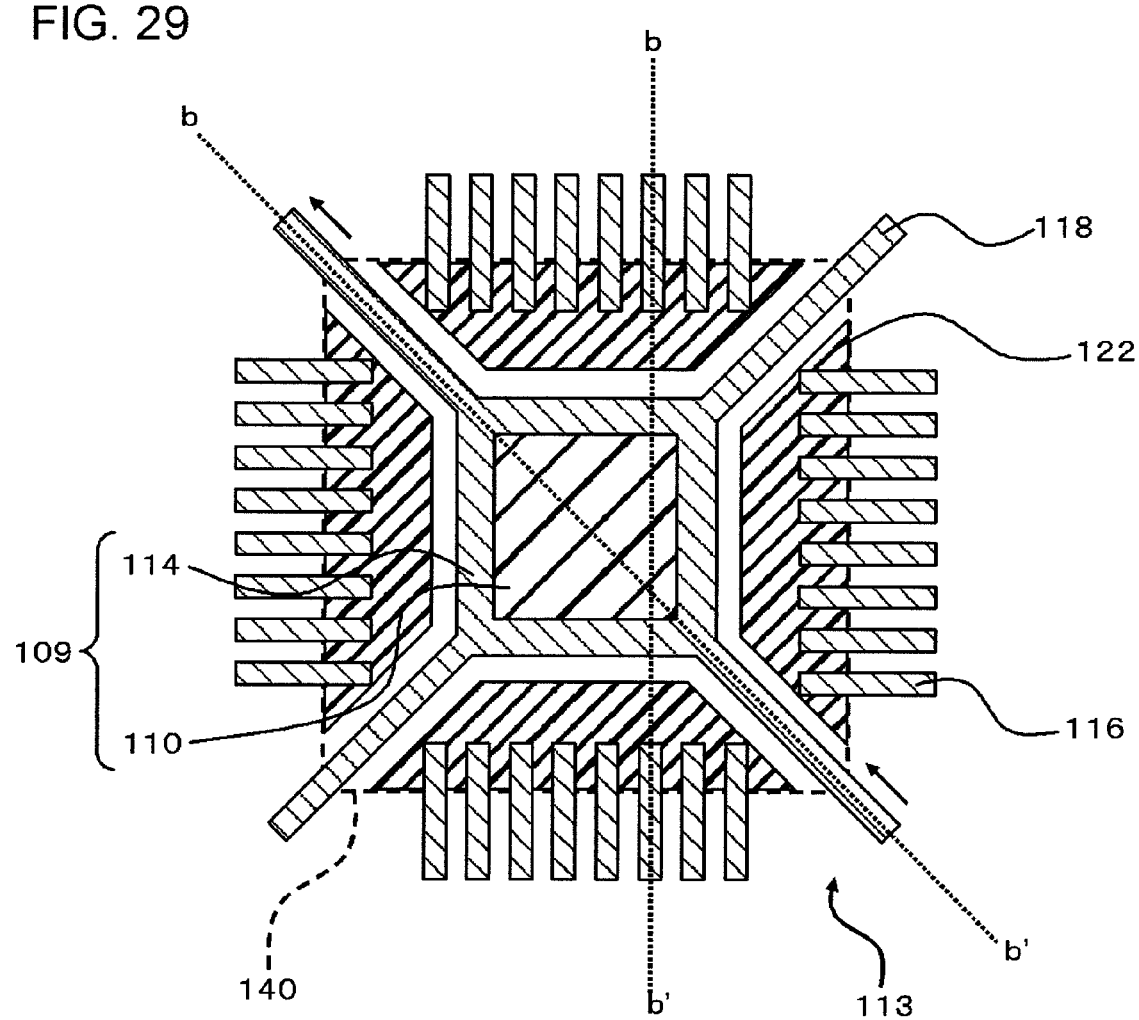
FIG. 29 represents a plan view illustrating another example of the configuration of the semiconductor device and a mold according to the fifth embodiment.

FIG. 29 represents a plan view illustrating another example of a configuration of the semiconductor device 100 and the mold 140 in regard to the manufacturing procedure according to the embodiment of the invention. This example is different from the configuration shown in FIGS. 24 and 25 in that the step portion 122 is not formed at a corner portion of the outermost edge of the central structure 109 and is divided. That is, in this example, the step portion 122 is not formed at a location under the hanging lead 118 of the lead frame 113. Even in this configuration, it is possible to obtain the same effect as that shown in FIGS. 24 and 25.

Sixth Embodiment

FIGS. 30A to 31D represent process cross-sectional views illustrating a manufacturing procedure of the semiconductor device 100 according to this embodiment of the invention. In FIGS. 30A to 31D, a movable type step portion 124 having the same planar shape as the step portion 120 shown in FIG. 6 in regard to the first embodiment may be included. FIGS. 30A to 31D may have a configuration corresponding to the cross-sectional view taken along a-a' line of the configuration shown in FIG. 6. In addition, here, an example where the sealing resin 130 is introduced from a side is shown, but the sealing resin 130 may be introduced from a corner portion of the mold 140 similarly to the configuration described in the first embodiment.

In this embodiment, the movable type step portion 124 is used for taking out semiconductor device 100 from the lower mold 140b of the mold 140 after the sealing resin 130 is hardened, and may be configured by an ejection pin (E pin).

In addition, in this embodiment, an introduction portion 152 that introduces the sealing resin 130 and a plunger 150 that extrudes the sealing resin 130 introduced into an introduction portion 152 are provided to the lower mold 140b of the mold 140.

Figure 30A:
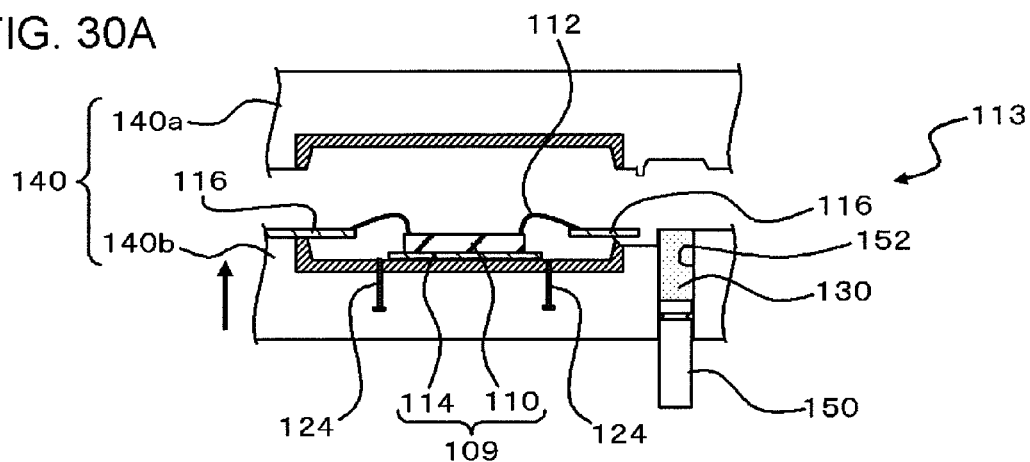
FIGS. 30A to 30C represent process cross-sectional views illustrating an example of a manufacturing procedure of a semiconductor device according to a sixth embodiment.
Figure 30B:
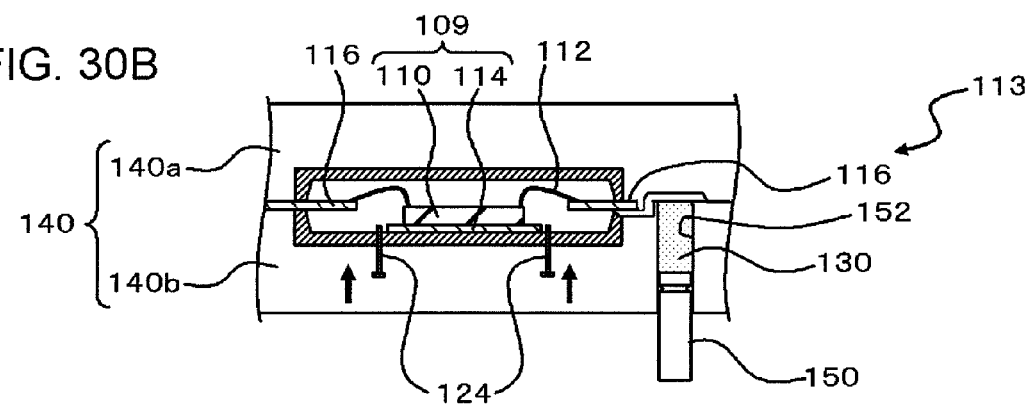

FIG. 30A illustrates a state where the lead frame 113 and the semiconductor chip 110 are disposed in the cavity of the lower mold 140b, and the sealing resin 130 is introduced in the introduction portion 152. Then, the lower mold 140b is made to move toward the upper mold 140a, and thereby a space for encapsulation with the sealing resin 130 is formed between the upper mold 140a and the lower mold 140b. Next, in this embodiment, the movable type step portion 124 is raised in such a manner that the height of the movable type step portion 124 from the bottom surface in the cavity of the lower mold 140b becomes equal to or greater than the height of the outermost edge of the central structure 109 (FIG. 30B).

Figure 30C:
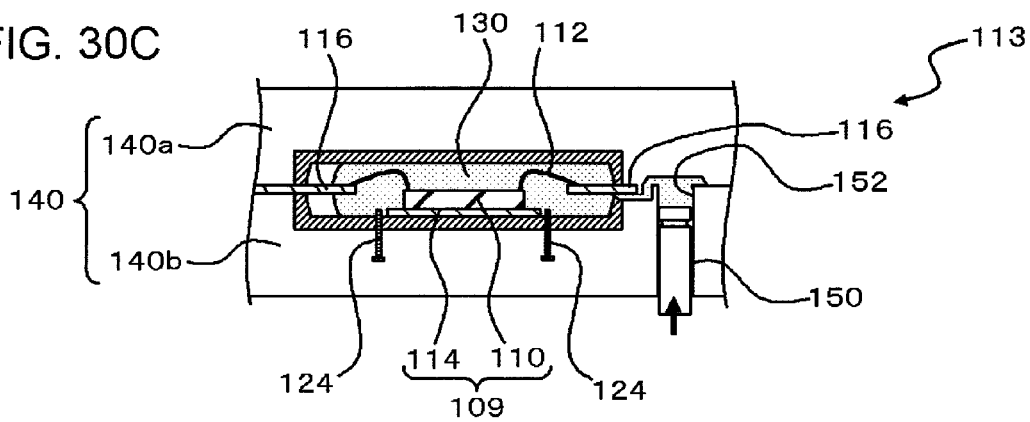

Subsequently, the plunger 150 is extruded into the inside of the introduction portion 152 and thereby the sealing resin 130 is introduced into the space inside the mold 140 (FIG. 30C). Then, after the sealing resin 130 is hardened, the lower mold 140b is made to move downward (FIG. 31A). In addition, the movable type step portion 124 is also made to move downward. In this manner, in this embodiment, it is also possible to obtain the semiconductor device 100 similar to that in the description with reference to FIGS. 1 to 3.

In addition, in a case where the movable step portion 124 is configured by, for example, the E pin, when the movable type step portion 124 is raised before and after the process shown in FIG. 31A, it is possible to take out the semiconductor device 100 from the lower mold 140b (FIG. 31B).

In addition, the configuration according to this embodiment may be applied to the step portion 122 shown in the second embodiment, and thereby the step portion 122 may be a movable type step portion.

Figure 36:
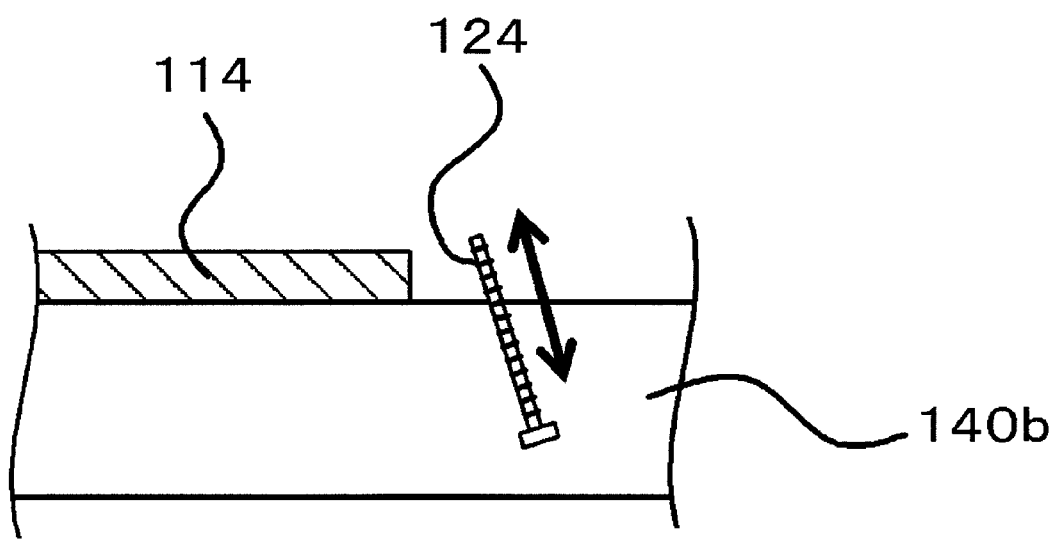
FIG. 36 represents a cross-sectional view illustrating a modification of a moveable type step portion shown in FIGS. 20 and 21.
Figure 37:
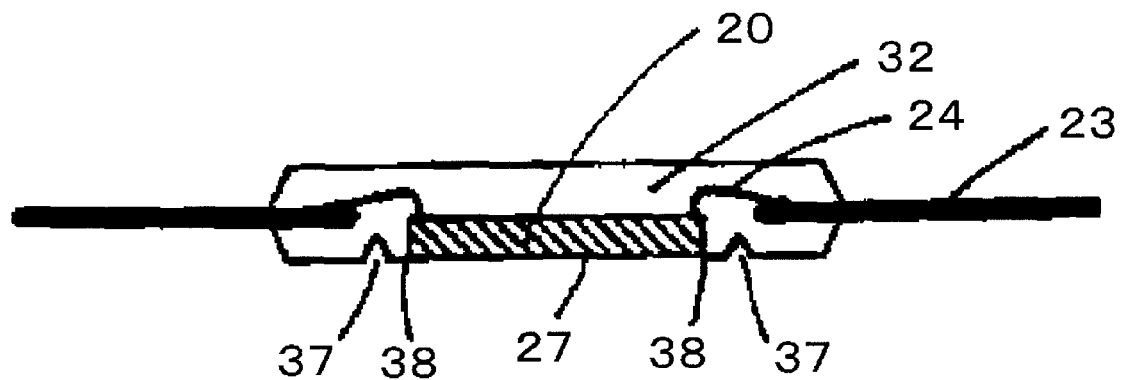
FIG. 37 represents a cross-sectional view illustrating a configuration of the semiconductor device described in Japanese Laid-Open Patent Publication No. 08-046090.

In this embodiment, it is also possible to obtain the same effect as that in the first and second embodiments. In addition, in regard to this embodiment, when the semiconductor device 100 is taken out, the movable type step portion 124 can be made to move downward from the cavity bottom surface of the lower mold 140b, such that the angle θ made by the side surface of the movable type step portion 124 facing the die pad 114 and the bottom surface of the lower mold 140b, which is described in the first embodiment with reference to FIG. 9A to 9D, may be 90° or more. For example, as shown in FIG. 36, the movable type step portion 124 may be configured in a manner that moves in an oblique direction.

Hereinafter, embodiments of the invention are described with reference to the drawings; these are illustrative only, and various configuration other than the above-described configurations may be adopted.

Figure 32:
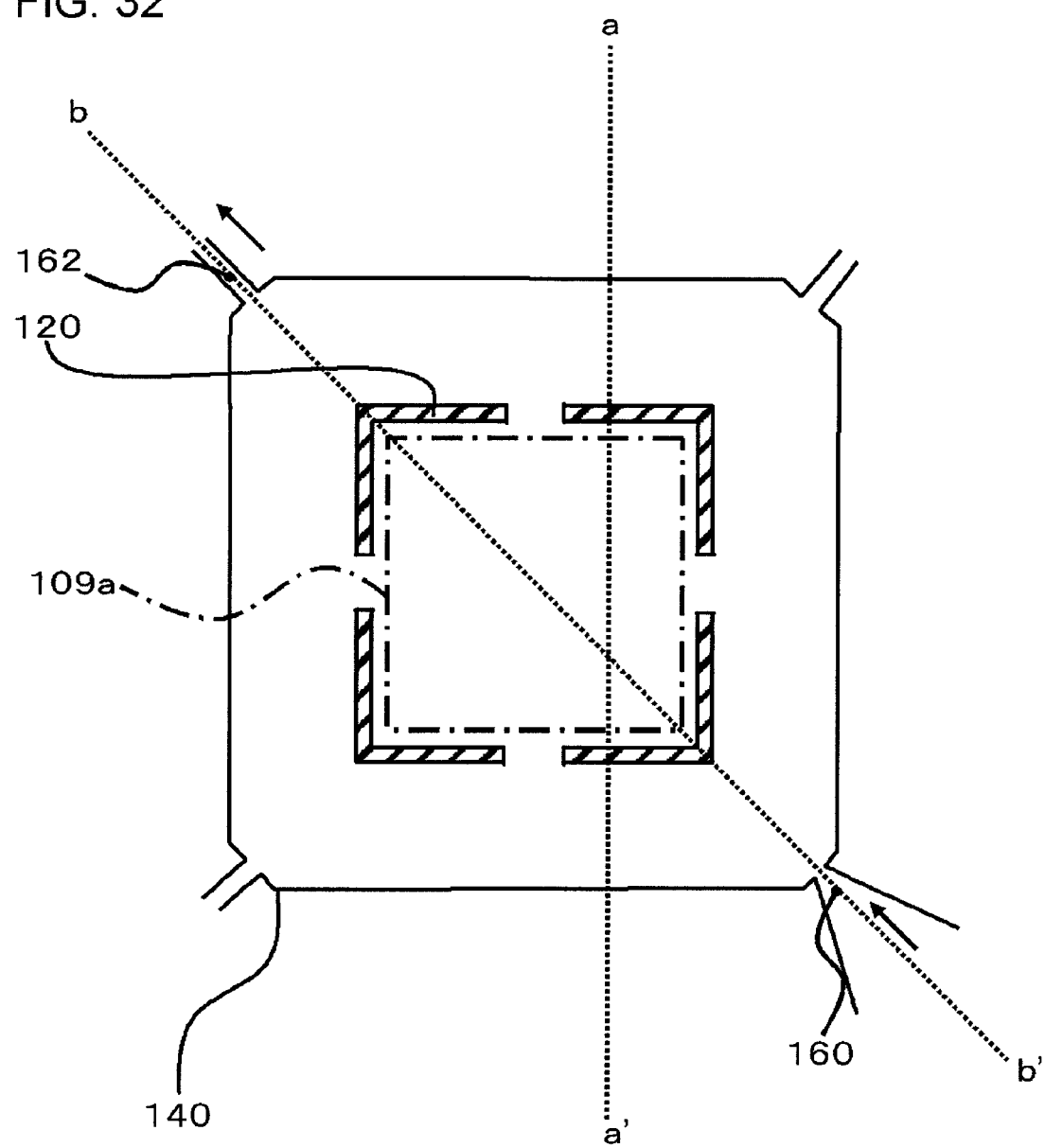
FIG. 32 represents a plan view illustrating another example of the configuration of the step portion formed on a surface of the lower mold according to the embodiments of the invention.

FIGS. 32 and 33 represents plan views illustrating another configuration of the step portion 120 provided in the cavity bottom surface of the lower mold 140b of the mold 140. For example, as shown in FIG. 32, the step portion 120 may be configured to be provided at the corner portion of the outermost edge 109a of the central structure, except for the end portion of each side of the outermost edge 109a of the central structure. In addition, as shown in FIG. 33, the step portion 120 may be provided only at a side adjacent to the gate 160 of the mold 140. As described above, a planar shape of the step portion 120 may have various shapes as long as the step portion 120 is provided along most regions of each side of the outermost edge of the central structure. This is true for the step portion 122 and the movable type step portion 124.

However, as shown in FIG. 33, in a case where the step portion 120 may be provided only at a side adjacent to the gate 160 of the mold 140, the shape of the concave portion 126 formed in the semiconductor device 100 may be different depending on the semiconductor device 100. For example, as shown in FIG. 34, in a case where the sealing resin 130 that is introduced from a sealing resin introduction path 164 is introduced to the inside of a plurality of molds 140, a positional relationship between a position aligning mark 109b and the concave portion 126 becomes different between those formed by a mold 140 shown in a right side and those formed by a mold 140 shown in a left side. Therefore, from this viewpoint, it is preferable that the step portion 120 (the step portion 122, and the movable type step portion 124) be configured to be uniformly formed at the periphery of the outermost edge 109a of the central structure.

In addition, in the above-described embodiments, there is described an example where the planar area of the die pad 114 is larger than that of the semiconductor chip 110, and therefore the outermost edge of the central structure 109 is defined by the outer edge of the die pad 114. However, the planar area of the semiconductor chip 110 may be larger than that of the die pad 114, and therefore the outermost edge of the central structure 109 may be defined by the outer edge of the semiconductor chip 110. In this case, the step portion such as the step portion 120, the step portion 122, and the movable type step portion 124, may have the height higher than that of the surface of the semiconductor chip 110.

In addition, in regard to the above-described embodiments, the following inventions are also disclosed.

(Additional Statement 1)

A semiconductor device including:

a central structure that includes a die pad and a semiconductor chip mounted on one plane of the die pad;

a plurality of lead terminals that is spaced from the die pad and is disposed at the periphery of the die pad along an outer edge of the die pad;

a hanging lead that has one end connected to the die pad and has an oblique portion that extends obliquely with respect to the one plane of the die pad in a direction away from the die pad; and a sealing resin that seals the central structure, a part of each of the plurality of lead terminals, and the hanging lead, wherein the rear surface of the die pad opposite to the one plane is formed to be exposed from one plane of the sealing resin, and a concave portion is formed in the one plane of the sealing resin at a location between a lower portion of the oblique portion of the hanging lead and an outermost edge of the central structure.

(Additional Statement 2)

The semiconductor device described in Additional Statement 1, wherein the concave portion is continuously formed to be parallel with the entirety of the outermost edge of the central structure.

(Additional Statement 3)

A semiconductor device including:

a central structure that includes a die pad and a semiconductor chip mounted on one plane of the die pad;

a plurality of lead terminals that is spaced from the die pad and is disposed at the periphery of the die pad along an outer edge of the die pad;

a hanging lead that has one end connected to the die pad and extends obliquely with respect to the one plane of the die pad in a direction away from the die pad; and a sealing resin that seals the central structure, a part of each of the plurality of lead terminals, and the hanging lead, wherein the rear surface of the die pad opposite to the one plane is formed to be exposed from one plane of the sealing resin, a concave portion, which is disposed to be parallel with at least one first side of an outermost edge of the central structure and a second side adjacent to the first side, respectively, is formed in the one plane of the sealing resin, and a distance between the outermost edge of the central structure and the concave portion is equal to or greater than 0.1 mm and equal to or less than 4 mm.

(Additional Statement 4)

A method of manufacturing a semiconductor device, including:

disposing a semiconductor chip structure, which includes a central structure that includes a die pad and a semiconductor chip mounted on one plane of the die pad, a plurality of lead terminals that is spaced from the die pad and is disposed at the periphery of the die pad along an outer edge of the die pad, and a hanging lead that has one end connected to the die pad and extends obliquely with respect to the one plane of the die pad in a direction away from the die pad, in such a manner that the rear surface opposite to the one plane of the die pad comes into contact with one plane of a mold at the inside of a cavity of the mold; and introducing a sealing resin to the cavity of the mold from the one plane side of the die pad, and sealing the central structure, a part of each of the plurality of lead terminals, and the hanging lead with the sealing resin, wherein in the sealing with the sealing resin, a step portion is formed on the one plane of the mold at a location between a lower portion of the oblique portion of the hanging lead and an outermost edge of the central structure.

(Additional Statement 5)

The method of manufacturing a semiconductor device described in Additional Statement 4, wherein the step portion is continuously formed to be parallel with the entirety of the outermost edge of the central structure.

(Additional Statement 6)

A method of manufacturing a semiconductor, including:

disposing a semiconductor chip structure, which includes a central structure that includes a die pad and a semiconductor chip mounted on one plane of the die pad, a plurality of lead terminals that is spaced from the die pad and is disposed at the periphery of the die pad along an outer edge of the die pad, and a hanging lead that has one end connected to the die pad and extends obliquely with respect to the one plane of the die pad in a direction away from the die pad, in such a manner that the rear surface opposite to the one plane of the die pad comes into contact with one plane of a mold at the inside of a cavity of the mold; and introducing a sealing resin to the cavity of the mold from the one plane side of the die pad, and sealing the central structure, a part of each of the plurality of lead terminals, and the hanging lead with the sealing resin, wherein in the sealing with the sealing resin, a step portion, which is disposed to be parallel with at least one first side of an outermost edge of the central structure and a second side adjacent to the first side, respectively, is formed in the one plane of the mold, and a distance between the outermost edge of the central structure and the step portion is equal to or greater than 0.1 mm and equal to or less than 4 mm.

(Additional Statement 7)

A mold for molding a sealing resin of a semiconductor including a central structure that includes a die pad and a semiconductor chip mounted on one plane of the die pad, a plurality of lead terminals that is spaced from the die pad and is disposed at the periphery of the die pad along an outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead, the mold including:

a cavity having one plane disposed in such a manner that the rear surface opposite to the one plane of the die pad comes into contact therewith; and a step portion that is formed on the one plane of the cavity and is disposed at a location between a lower portion of the oblique portion of the hanging lead and an outermost edge of the central structure at the time of disposing the central structure in the cavity, of introducing the sealing resin from the one plane side of the die pad, and of sealing the central structure, a part of each of the plurality of lead terminals, and the hanging lead with the sealing resin.

(Additional Statement 8)

The mold described in Additional Statement 7, wherein the step portion is continuously formed to be parallel with the entirety of the outermost edge of the central structure.

(Additional Statement 9)

A mold for molding a sealing resin of a semiconductor including a central structure that includes a die pad and a semiconductor chip mounted on one plane of the die pad, a plurality of lead terminals that is spaced from the die pad and is disposed at the periphery of the die pad along an outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead, the mold including:

a cavity having one plane disposed in such a manner that the rear surface opposite to the one plane of the die pad comes into contact therewith; and a step portion that is formed on the one plane of the cavity, and is disposed to be parallel with at least one first side of an outermost edge of the central structure and a second side adjacent to the first side, respectively, at the time of disposing the central structure in the cavity, of introducing the sealing resin from the one plane side of the die pad, and of sealing the central structure, a part of each of the plurality of lead terminals, and the hanging lead with the sealing resin, wherein a distance between the outermost edge of the central structure and the step portion is equal to or greater than 0.1 mm and equal to or less than 4 mm.

It is apparent that the present invention is not limited to the above embodiment, and may be modified and changed without departing from the scope and spirit of the invention.

What is claimed is:

1. A semiconductor device comprising:
   a central structure that includes a die pad and a semiconductor chip mounted on one plane of the die pad;
   a plurality of lead terminals that is spaced from the die pad and is disposed at the periphery of the die pad along an outer edge of the die pad;
   a hanging lead that has one end connected to the die pad and extends obliquely with respect to the one plane of the die pad in a direction away from the die pad; and
   a sealing resin that seals the central structure, a part of each of the plurality of lead terminals, and the hanging lead,
   wherein a rear surface of the die pad opposite to the one plane is formed to be exposed from one plane of the sealing resin,
   a concave portion which penetrates only the sealing resin, the concave portion being disposed to be parallel with at least one first side of an outermost edge of the central structure and a second side adjacent to the first side, respectively, is formed in the one plane of the sealing resin, and
   a depth of the concave portion at a location under the hanging lead is shallower than that at a location other than the location under the hanging lead, or the concave portion is not formed at the location under the hanging lead.

2. The semiconductor device according to claim 1, wherein the concave portion is formed to be parallel with each side of the outermost edge of the central structure.

3. The semiconductor device according to claim 1,
wherein the concave portion is continuously formed to be parallel with the entirety of the outermost edge of the central structure.

4. The semiconductor device according to claim 1,
wherein when the thickness of the die pad is set to $t_1$, a distance between the die pad and the concave portion is shorter than $5 t_1$.

5. The semiconductor device according to claim 1,
wherein when the thickness of the die pad is set to $t_1$, the distance between the die pad and the concave portion is shorter than $t_1$.

6. The semiconductor device according to claim 1,
wherein in the one plane of the sealing resin, the inside of the concave portion has surface roughness lower than that in other regions.

7. The semiconductor device according to claim 1,
wherein a shape of a cross-section of the concave portion in a direction orthogonal to an extending direction of the concave portion is a trapezoid.

8. The semiconductor device according to claim 1,
wherein an angle made by a side surface of the concave portion opposite to the die pad and a surface forming an opening of the concave portion is 87° or less.

9. The semiconductor device according to claim 1,
wherein each of the lead terminals has a first plated layer at a die pad side end portion,
the rear surface of the die pad has a second plated layer, and
the first and second plated layers are formed of the same material as each other.

10. The semiconductor device according to claim 9,
wherein the first and second plated layers include Pd.

11. The semiconductor device according to claim 1,
wherein the concave portion is formed to extend to an outer edge of the sealing resin.

12. A semiconductor device comprising:
a central structure that includes a die pad and a semiconductor chip mounted on one plane of the die pad;
a plurality of lead terminals that is spaced from the die pad and is disposed at the periphery of the die pad along an outer edge of the die pad;
a hanging lead that has one end connected to the die pad and extends obliquely with respect to the one plane of the die pad in the direction away from the die pad; and
a sealing resin that seals the central structure, a part of each of the plurality of lead terminals, and the hanging lead,
wherein a rear surface of the die pad opposite to the one plane is formed to be exposed from one plane of the sealing resin, and
a concave portion which penetrates only the sealing resin, the concave portion being disposed to be parallel with at least one first side of an outermost edge of the central structure and a second side adjacent to the first side, respectively, and which has a depth equal to or greater than a height of the outermost edge of the central structure, is formed in the one plane of the sealing resin.

13. The semiconductor device according to claim 12,
wherein the concave portion is formed to be parallel with each side of the outermost edge of the central structure.

14. The semiconductor device according to claim 12,
wherein the concave portion is continuously formed to be parallel with the entirety of the outermost edge of the central structure.

15. The semiconductor device according to claim 12,
wherein when the thickness of the die pad is set to $t_1$, a distance between the die pad and the concave portion is shorter than $5 t_1$.

16. The semiconductor device according to claim 12,
wherein when the thickness of the die pad is set to $t_1$, the distance between the die pad and the concave portion is shorter than $t_1$.

17. The semiconductor device according to claim 12,
wherein in the one plane of the sealing resin, the inside of the concave portion has surface roughness lower than that in other regions.

18. The semiconductor device according to claim 12,
wherein a shape of a cross-section of the concave portion in a direction orthogonal to an extending direction of the concave portion is a trapezoid.

19. The semiconductor device according to claim 12,
wherein an angle made by a side surface of the concave portion opposite to the die pad and a surface forming an opening of the concave portion is 87° or less.

20. The semiconductor device according to claim 12,
wherein each of the lead terminals has a first plated layer at a die pad side end portion,
the rear surface of the die pad has a second plated layer, and
the first and second plated layers are formed of the same material as each other.

21. The semiconductor device according to claim 20,
wherein the first and second plated layers include Pd.

22. The semiconductor device according to claim 12,
wherein the concave portion is formed to extend to an outer edge of the sealing resin.

23. A mold for molding a sealing resin of a semiconductor device including a central structure that includes a die pad and a semiconductor chip mounted on one plane of the die pad, a plurality of lead terminals that is spaced from the die pad and is disposed at the periphery of the die pad along an outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead, the mold comprising:
a cavity having one plane disposed in such a manner that a rear surface opposite to the one plane of the die pad comes into contact therewith; and
a step portion that is formed on the one plane of the cavity and is disposed to be parallel with at least one first side of an outermost edge of the central structure and a second side adjacent to the first side, respectively, at the time of disposing the central structure in the cavity, of introducing the sealing resin from the one plane side of the die pad, and of sealing the central structure, a part of each of the plurality of lead terminals, and the hanging lead with the sealing resin,
wherein a height of the step portion at a location under the hanging lead is lower than that at a location other than the location under the hanging lead, or the step portion is not formed at the location under the hanging lead.

24. The mold according to claim 23,
wherein the step portion is formed to be parallel with each side of the outermost edge of the central structure.

25. A mold for molding a sealing resin of a semiconductor including a central structure that includes a die pad and a semiconductor chip mounted on one plane of the die pad, a plurality of lead terminals that is spaced from the die pad and is disposed at the periphery of the die pad along an outer edge of the die pad, a hanging lead that has one end connected to the die pad and extends obliquely with respect to the one plane of the die pad in a direction away from the die pad, and the sealing resin that seals the central structure, a part of each of the plurality of lead terminals, and the hanging lead, the mold comprising:
- a cavity having one plane disposed in such a manner that a rear surface opposite to the one plane of the die pad comes into contact therewith; and
- a step portion that is formed on the one plane of the cavity, and is disposed to be parallel with at least one first side of an outermost edge of the central structure and a second side adjacent to the first side, respectively, at the time of disposing the central structure in the cavity, of introducing the sealing resin from the one plane side of the die pad, and of sealing the central structure, a part of each of the plurality of lead terminals, and the hanging lead with the sealing resin, and has a height equal to or greater than a height of the outermost edge of the central structure.

26. The mold according to claim 23,
wherein the step portion is continuously formed to be parallel with the entirety of the outermost edge of the central structure.

27. The mold according to claim 23,
wherein the step portion is formed to extend to an outer edge of the cavity.

28. The mold according to claim 23,
wherein the step portion is configured to be movable in a vertical direction, and is moved to have a height equal to or greater than that of the outermost edge of the central structure during the sealing with the sealing resin.

29. The mold according to claim 28,
wherein the step portion includes an ejection pin for taking out the semiconductor device formed after sealing the central structure and a part of each of the plurality of lead terminals with the sealing resin from the mold.

30. A sealing device comprising the mold according to claim 23.

31. The mold according to claim 25,
wherein the step portion is formed to be parallel with each side of the outermost edge of the central structure.

32. The mold according to claim 25,
wherein the step portion is continuously formed to be parallel with the entirety of the outermost edge of the central structure.

33. The mold according to claim 25,
wherein the step portion is formed to extend to an outer edge of the cavity.

34. The mold according to claim 25,
wherein the step portion is configured to be movable in a vertical direction, and is moved to have a height equal to or greater than that of the outermost edge of the central structure during the sealing with the sealing resin.

35. The mold according to claim 34,
wherein the step portion includes an ejection pin for taking out the semiconductor device formed after sealing the central structure and a part of each of the plurality of lead terminals with the sealing resin from the mold.

36. A sealing device comprising the mold according to claim 25.

* * * * *